(12) United States Patent
Okita et al.

(10) Patent No.: US 12,485,461 B2
(45) Date of Patent: Dec. 2, 2025

(54) SUBSTRATE CLEANING DEVICE, SUBSTRATE CLEANING SYSTEM, SUBSTRATE PROCESSING SYSTEM, SUBSTRATE CLEANING METHOD AND SUBSTRATE PROCESSING METHOD

(71) Applicant: SCREEN HOLDINGS CO., LTD., Kyoto (JP)

(72) Inventors: Nobuaki Okita, Kyoto (JP); Junichi Ishii, Kyoto (JP); Kazuki Nakamura, Kyoto (JP); Takashi Shinohara, Kyoto (JP); Yoshifumi Okada, Kyoto (JP); Tomoyuki Shinohara, Kyoto (JP); Takuma Takahashi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 138 days.

(21) Appl. No.: 17/864,751

(22) Filed: Jul. 14, 2022

(65) Prior Publication Data
US 2023/0017418 A1     Jan. 19, 2023

(30) Foreign Application Priority Data
Jul. 15, 2021   (JP) .................................. 2021-117468

(51) Int. Cl.
*B08B 7/04*     (2006.01)
*B08B 3/04*     (2006.01)
(Continued)

(52) U.S. Cl.
CPC .................. *B08B 7/04* (2013.01); *B08B 3/04* (2013.01); *B08B 11/02* (2013.01); *B08B 13/00* (2013.01)

(58) Field of Classification Search
None
See application file for complete search history.

(56) References Cited

U.S. PATENT DOCUMENTS 6,151,744 A    11/2000   Ohtani et al. .................. 15/88.2
8,166,985 B2    5/2012   Nishiyama et al. .......... 134/137
(Continued)

FOREIGN PATENT DOCUMENTS

CN    110277333 A    9/2019
JP    H 104072 A    1/1998
(Continued)

OTHER PUBLICATIONS

KR 20200115104 A translation, Substrate Processing Device, Substrate Processing Method, and Semiconductor Manufacturing Method, Ito (Year: 2020).*

(Continued)

*Primary Examiner* — Cristi J Tate-Sims
(74) *Attorney, Agent, or Firm* — OSTROLENK FABER LLP

(57) ABSTRACT

An upper holding device holds a substrate in a horizontal attitude without rotating the substrate. A lower holding device rotates a substrate while holding the substrate by suction. A substrate held by the upper holding device is cleaned with use of a cleaning liquid, and a substrate held by the lower holding device is cleaned with use of a cleaning liquid. Gas in a processing space is exhausted by exhaust equipment of a factory through an exhaust system. When a substrate is held by the upper holding device, gas in the processing space is not exhausted or gas in the processing space is exhausted at a first flow rate. Gas in the processing space is exhausted at a second or third flow rate that is higher than the first flow rate when the substrate is held by the lower holding device.

8 Claims, 22 Drawing Sheets

(51) Int. Cl.
*B08B 11/02* (2006.01)
*B08B 13/00* (2006.01)

(56) References Cited

U.S. PATENT DOCUMENTS

| | | |
|---|---|---|
| 9,947,556 B2 | 4/2018 | Takiguchi et al. |
| 2006/0003105 A1 | 1/2006 | Kobayashi et al. ........ 427/372.2 |
| 2009/0000544 A1* | 1/2009 | Weilermann ........ H01L 21/6838 118/75 |
| 2009/0120472 A1 | 5/2009 | Nishiyama et al. .......... 134/157 |
| 2012/0064256 A1* | 3/2012 | Higashijima ..... H01L 21/68792 427/532 |
| 2014/0137893 A1 | 5/2014 | Otsuka et al. .................. 134/18 |
| 2015/0027492 A1 | 1/2015 | Takiguchi et al. ................ 134/6 |
| 2016/0236239 A1 | 8/2016 | Nishiyama |
| 2017/0120278 A1 | 5/2017 | Hashimoto |
| 2017/0221696 A1 | 8/2017 | Nishiyama |
| 2019/0214245 A1 | 7/2019 | Nishiyama |
| 2020/0312697 A1 | 10/2020 | Ito et al. |
| 2021/0210338 A1 | 7/2021 | Nishiyama |

FOREIGN PATENT DOCUMENTS

| | | |
|---|---|---|
| JP | 2002-373877 A | 12/2002 |
| JP | 3393016 B2 | 4/2003 |
| JP | 2005-252137 A | 9/2005 |
| JP | 2014-197592 A | 10/2014 |
| JP | 2015-023248 A | 2/2015 |
| JP | 5904169 B2 | 4/2016 |
| JP | 2017-175041 A | 9/2017 |
| JP | 2019-163913 A | 9/2019 |
| KR | 10-2020-0115104 A | 10/2020 |
| TW | 201941331 A | 10/2019 |
| WO | WO 2021/053995 A1 | 3/2021 |

OTHER PUBLICATIONS

WO 2021053995 A1, Substrate cleaning device, Komori (Year: 2021).*
JP 2014197592, Substrate processor, Akihiko (Year: 2014).*
Decision to Grant a Patent dated Apr. 13, 2023 issued in corresponding Taiwanese Patent Application No. 111123806.
Office Action dated Mar. 5, 2025 in corresponding Japanese Patent Application No. 2021-117468.

* cited by examiner

FIG. 7
PLAN VIEW
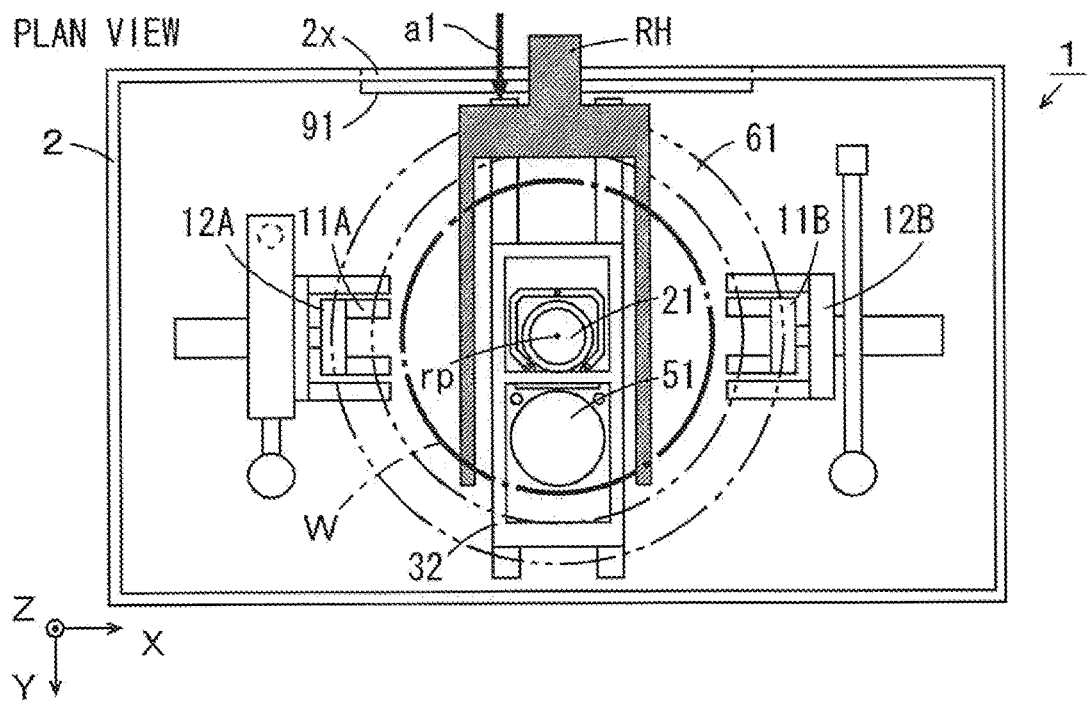
SIDE VIEW TAKEN ALONG LINE A-A
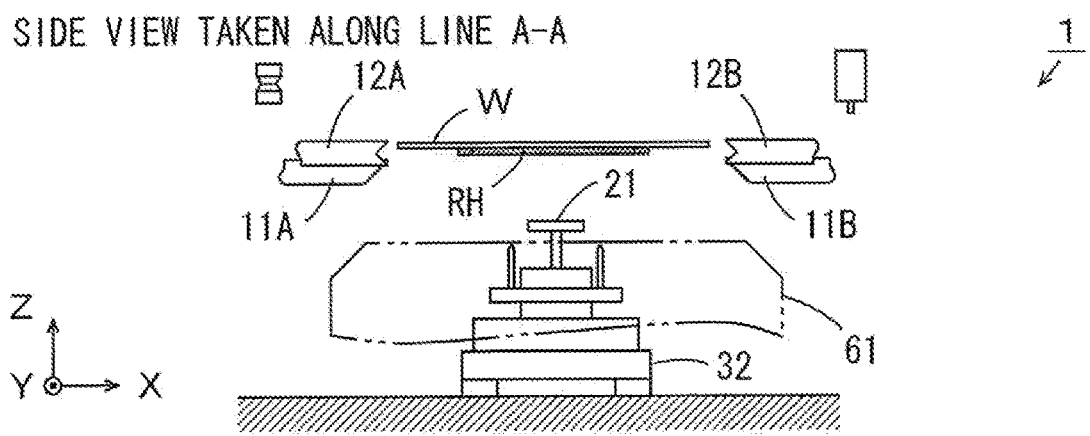
SIDE VIEW TAKEN ALONG LINE B-B
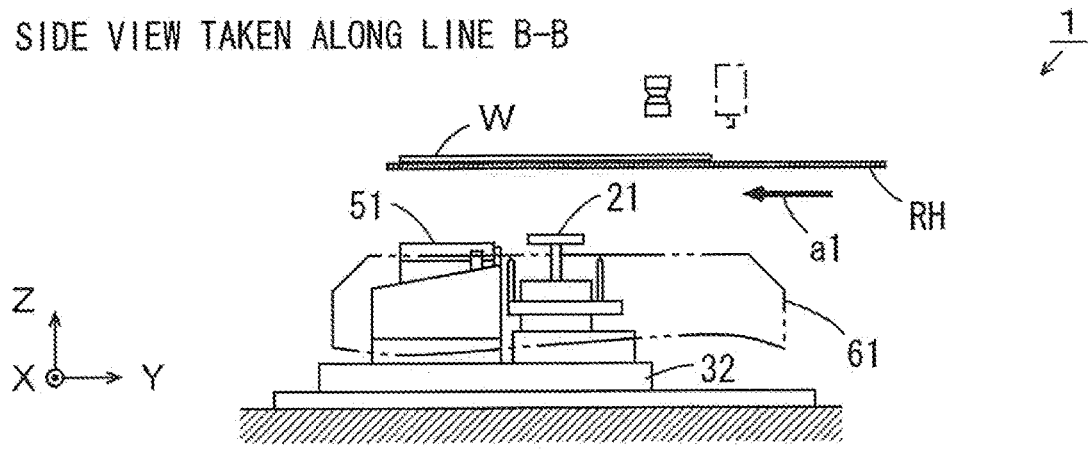

FIG. 8
PLAN VIEW
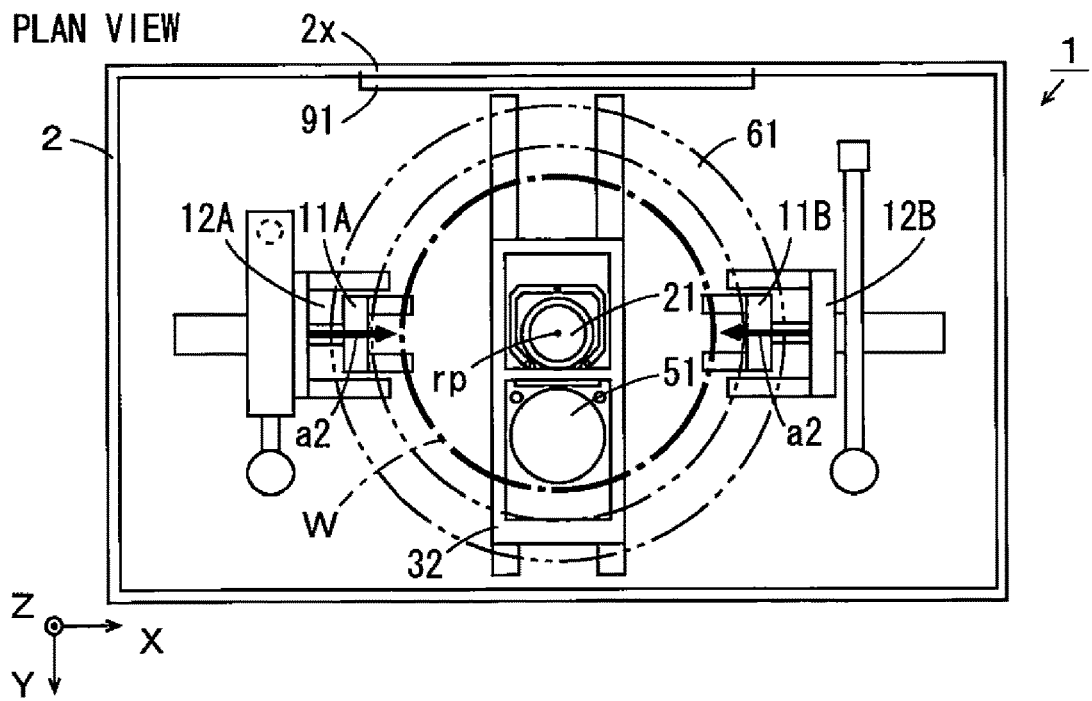
SIDE VIEW TAKEN ALONG LINE A-A
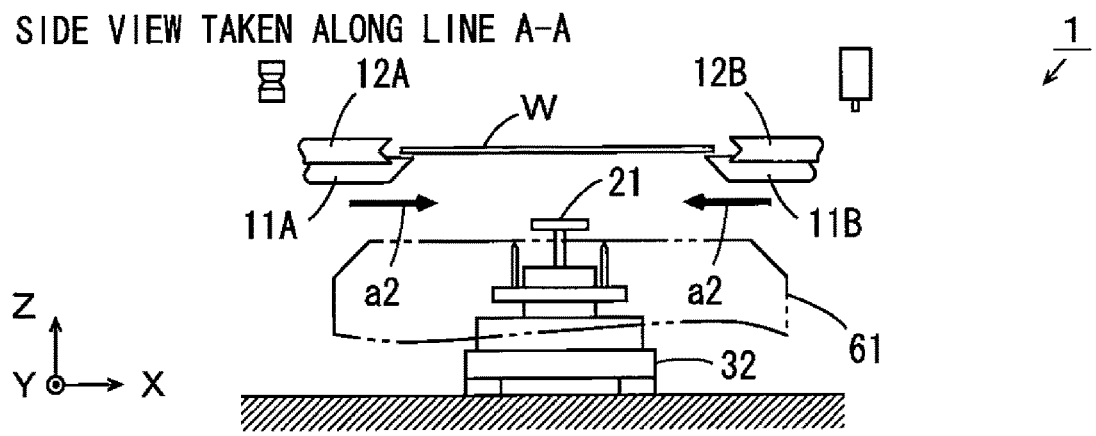
SIDE VIEW TAKEN ALONG LINE B-B
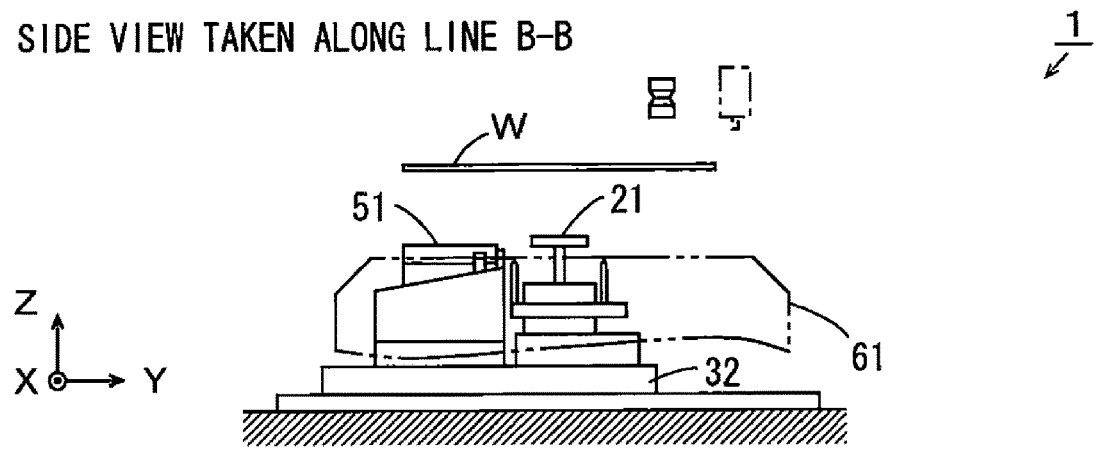

FIG. 9
PLAN VIEW
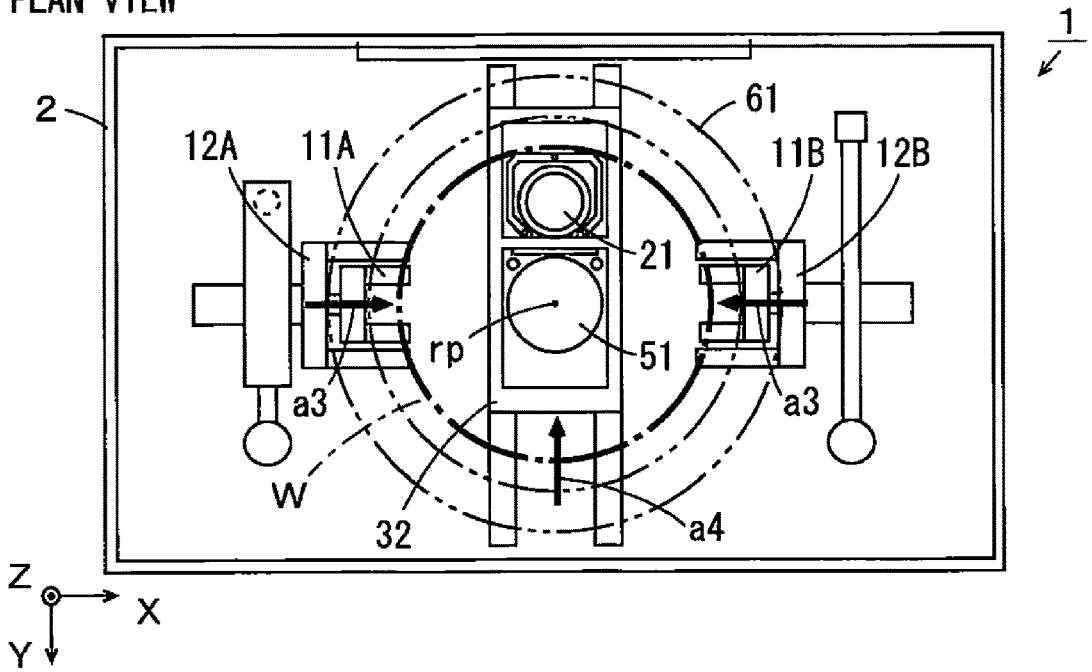
SIDE VIEW TAKEN ALONG LINE A-A
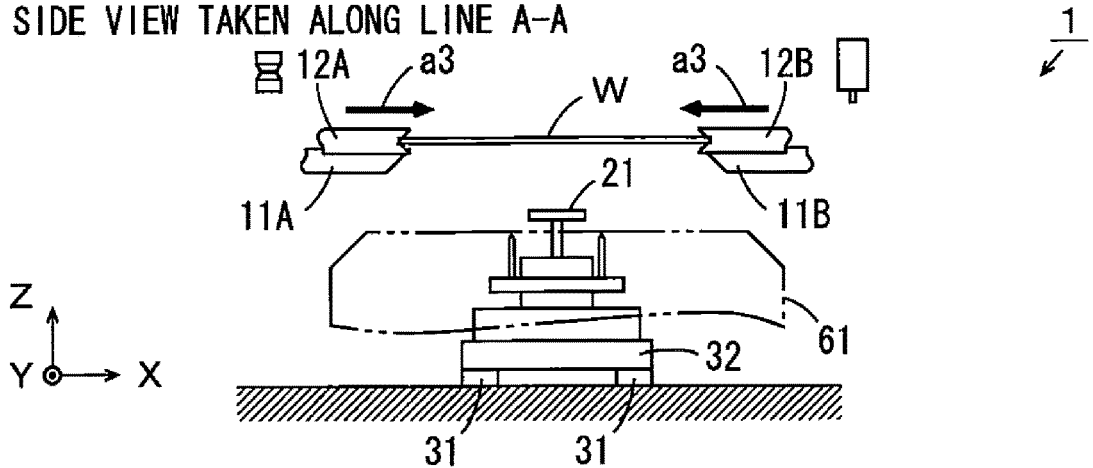
SIDE VIEW TAKEN ALONG LINE B-B
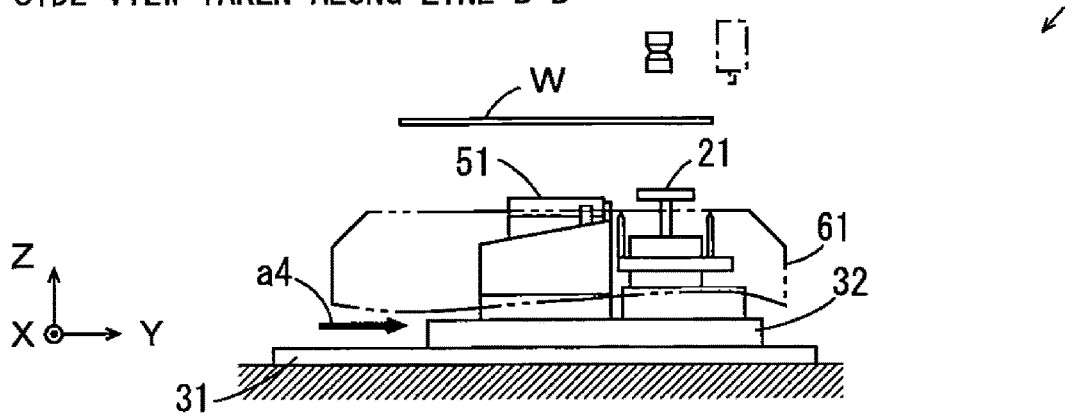

FIG. 10
PLAN VIEW
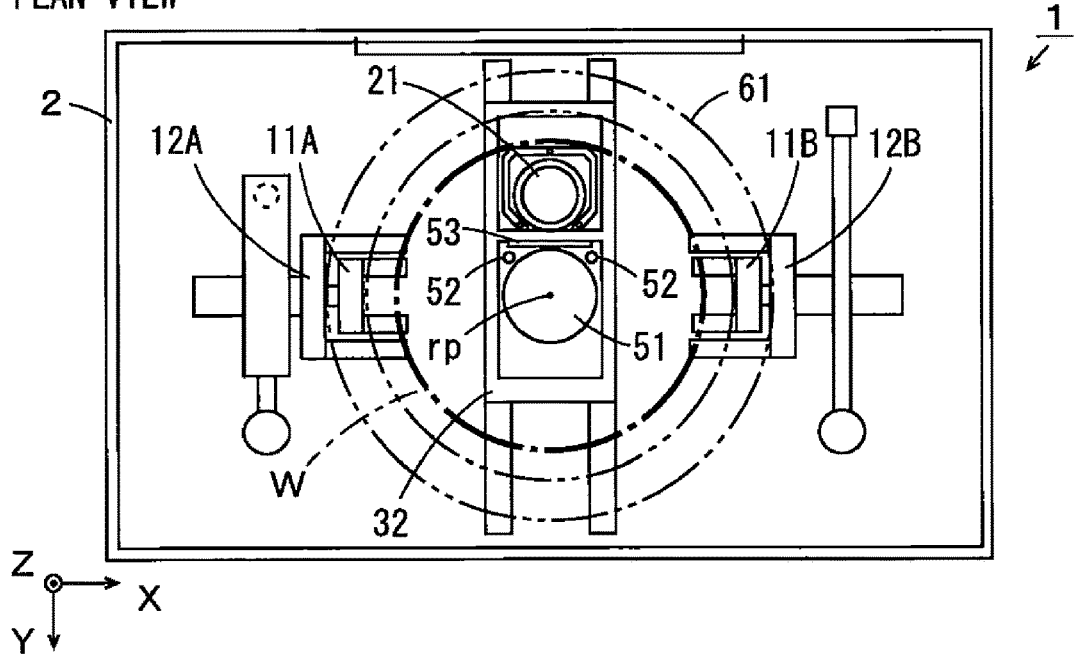
SIDE VIEW TAKEN ALONG LINE A-A
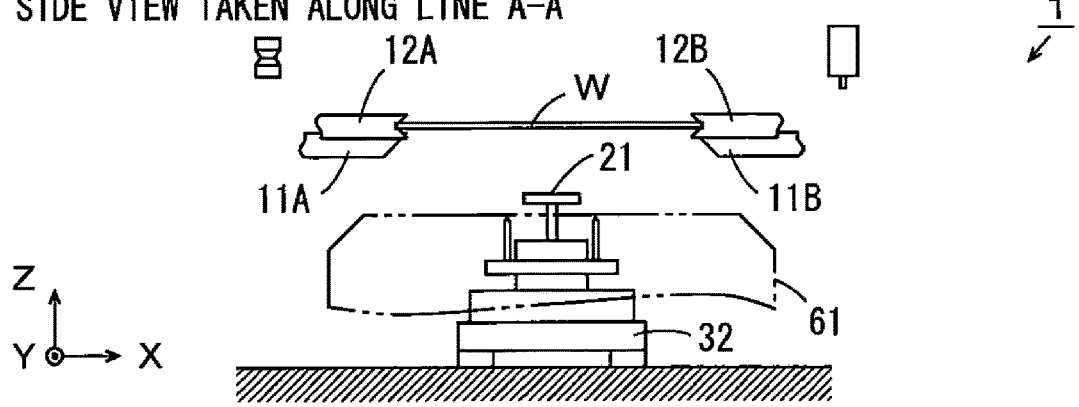
SIDE VIEW TAKEN ALONG LINE B-B
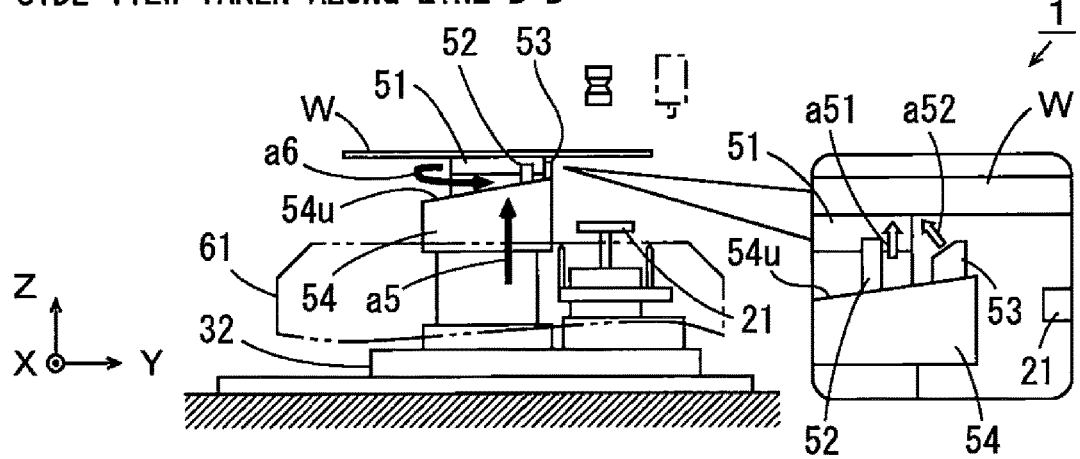

FIG. 11
PLAN VIEW
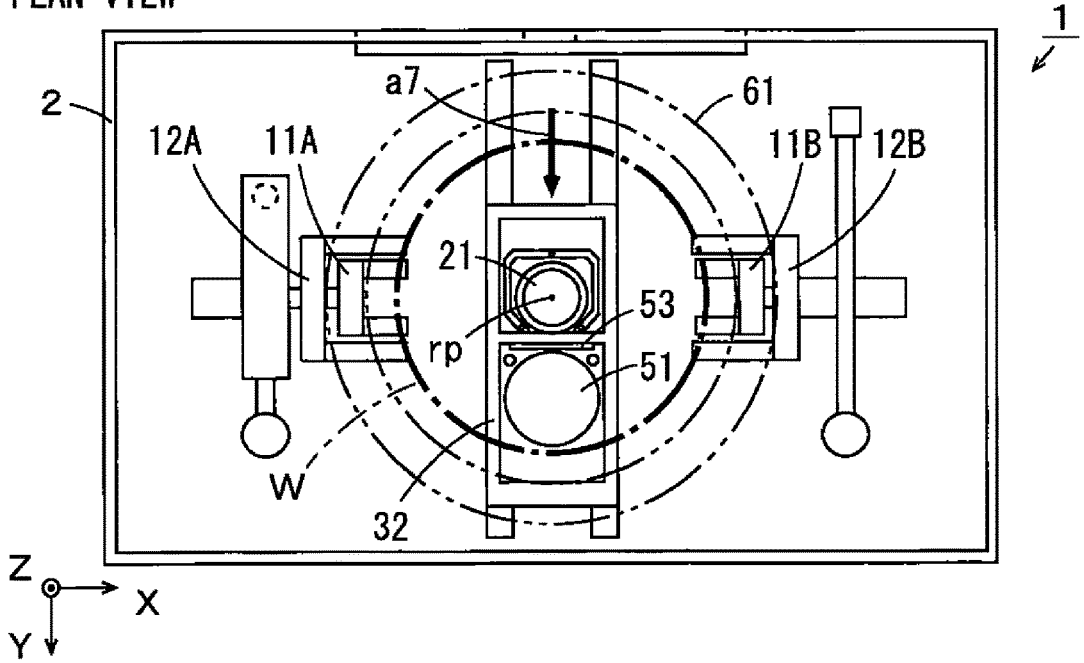
SIDE VIEW TAKEN ALONG LINE A-A
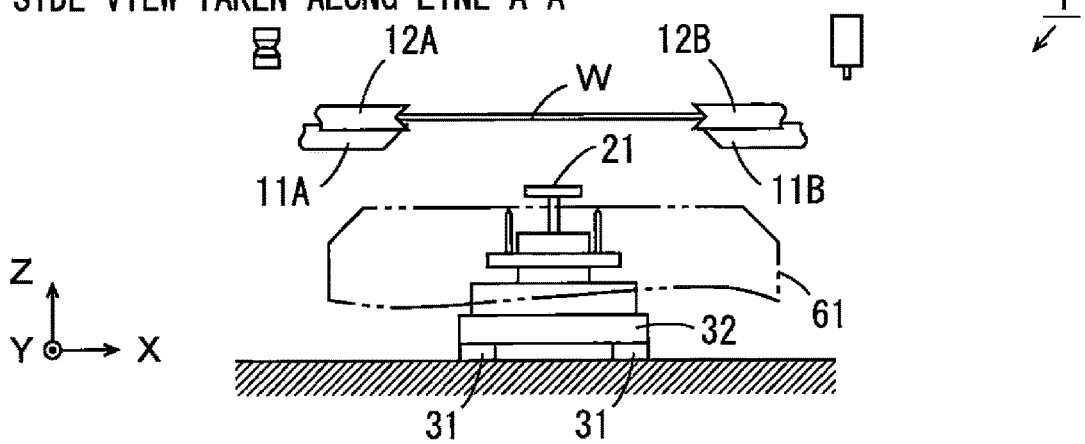
SIDE VIEW TAKEN ALONG LINE B-B
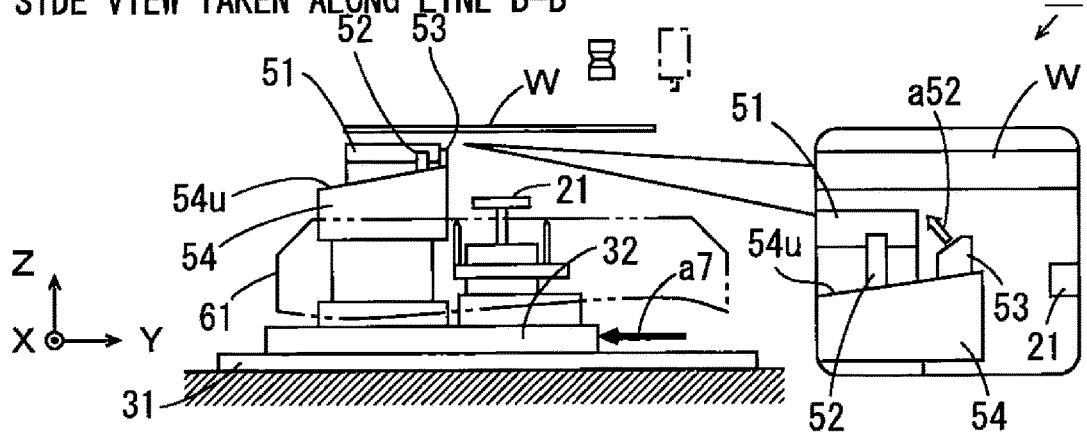

FIG. 12
PLAN VIEW
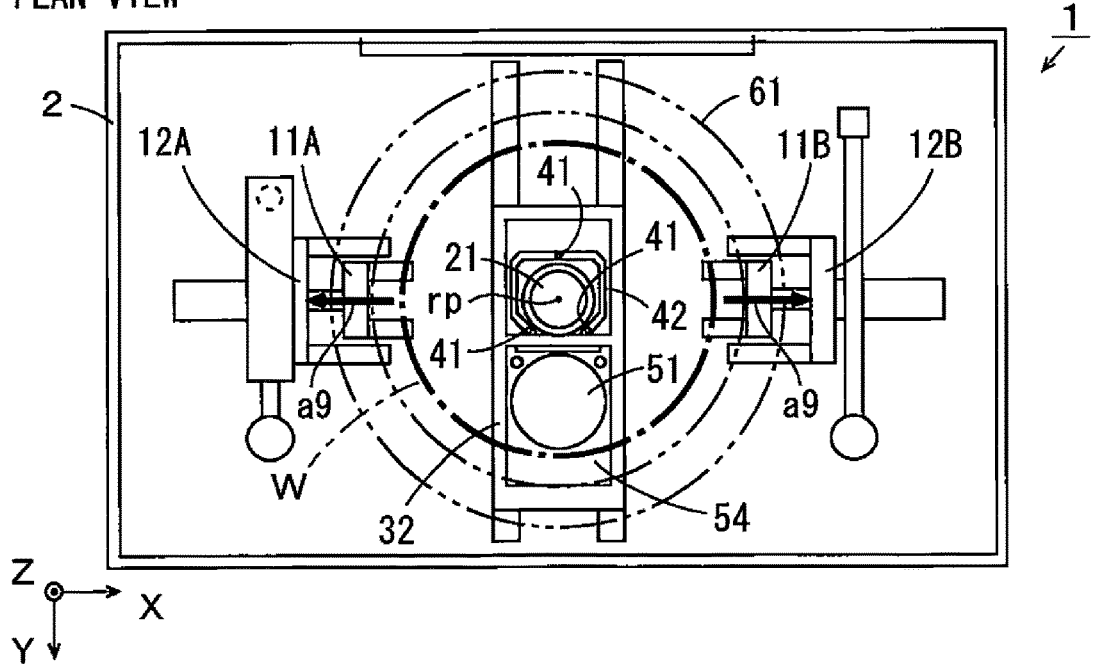
SIDE VIEW TAKEN ALONG LINE A-A
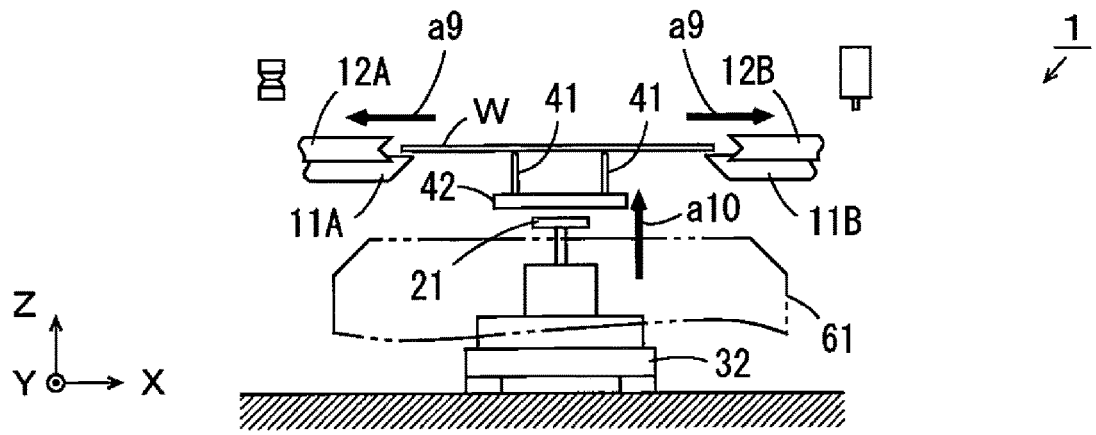
SIDE VIEW TAKEN ALONG LINE B-B
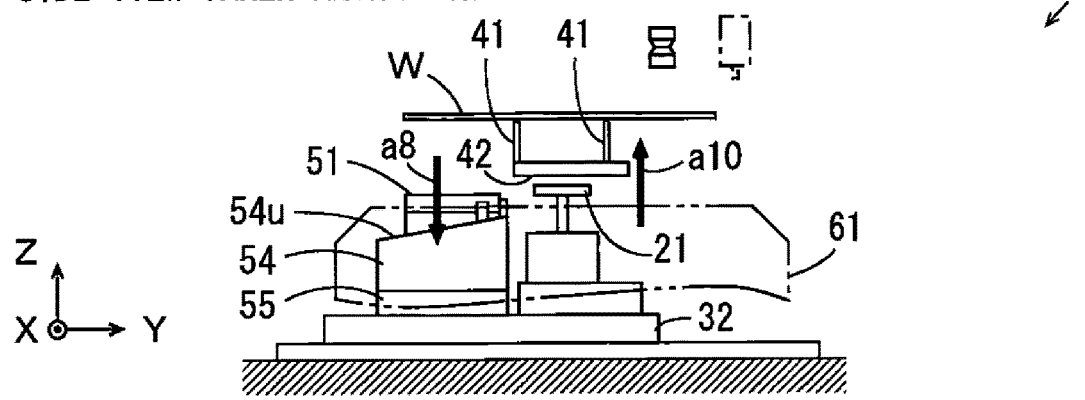

FIG. 13
PLAN VIEW
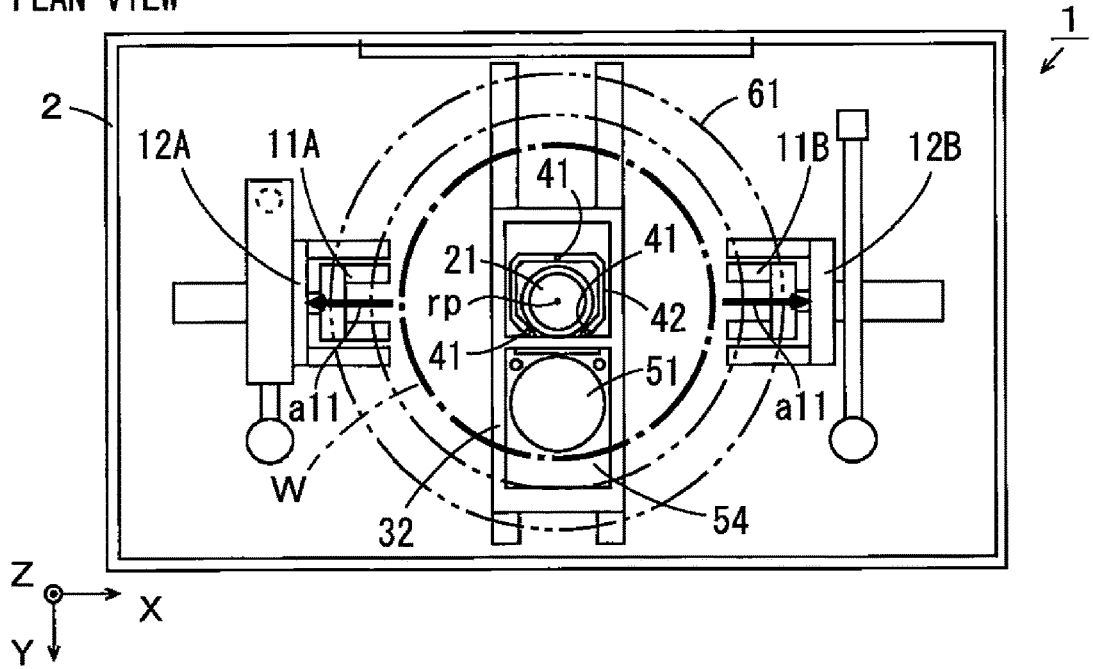
SIDE VIEW TAKEN ALONG LINE A-A
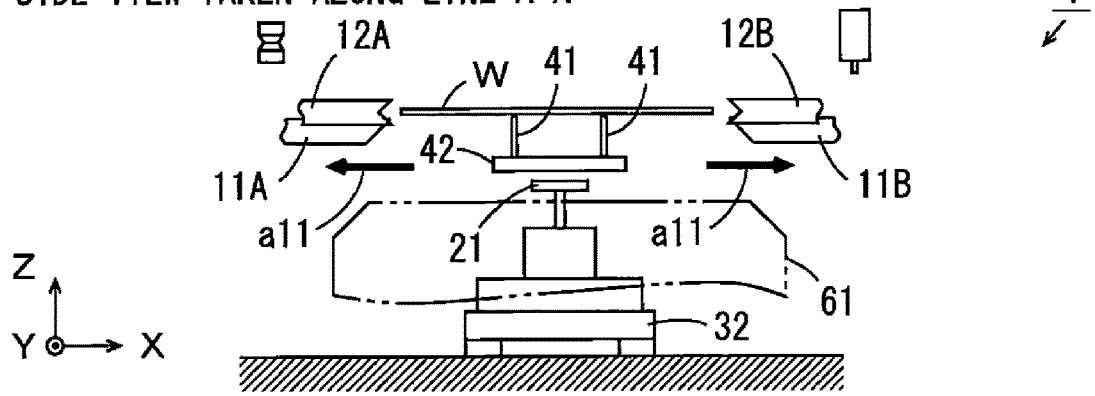
SIDE VIEW TAKEN ALONG LINE B-B
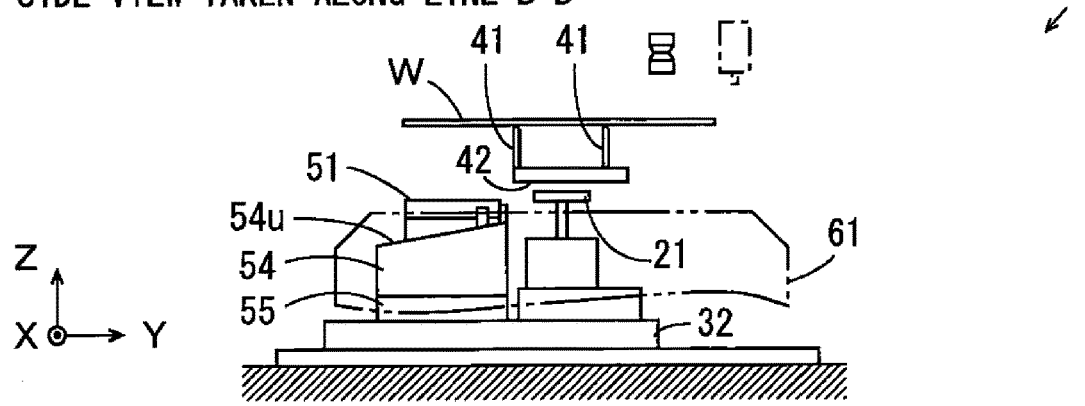

FIG. 14
PLAN VIEW
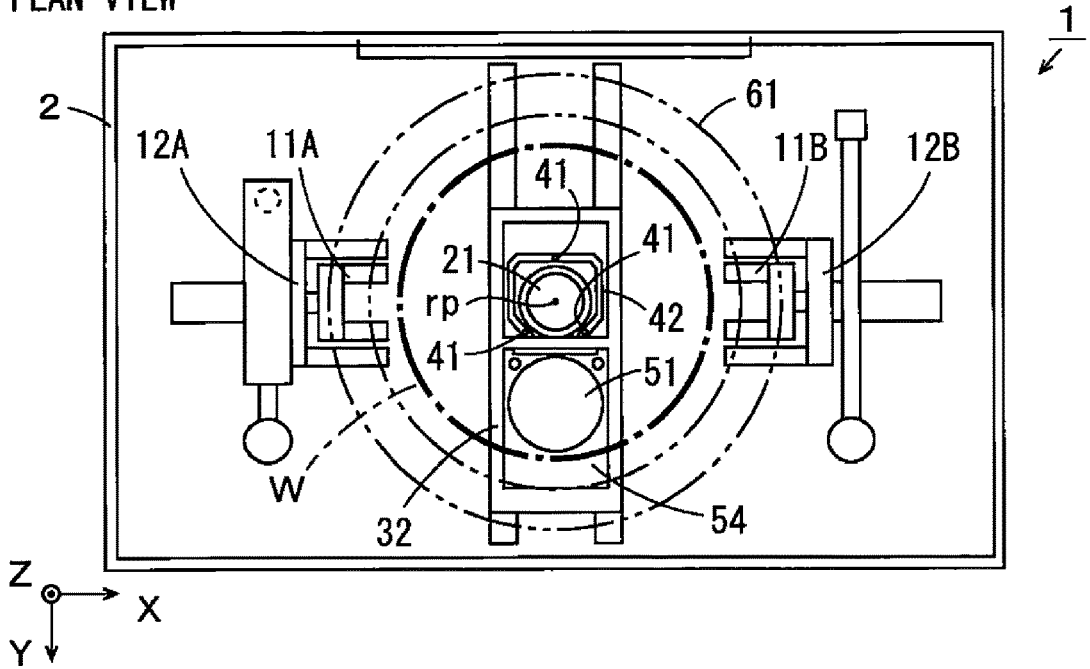
SIDE VIEW TAKEN ALONG LINE A-A
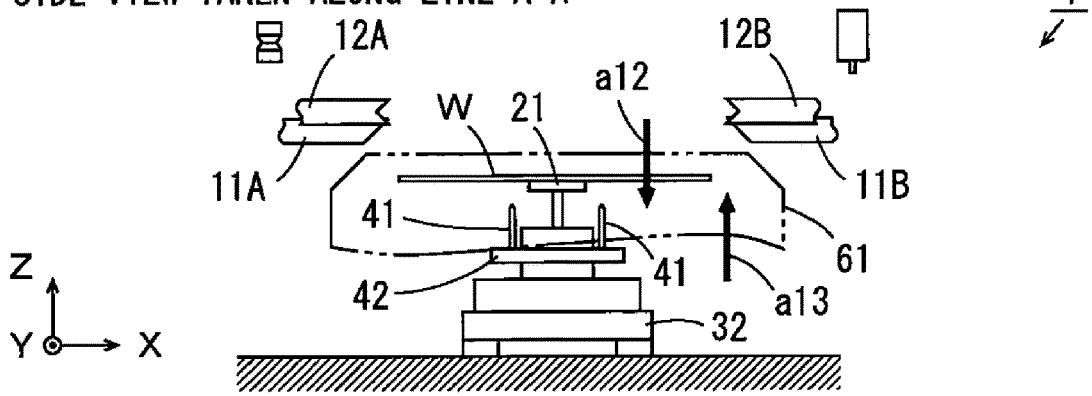
SIDE VIEW TAKEN ALONG LINE B-B
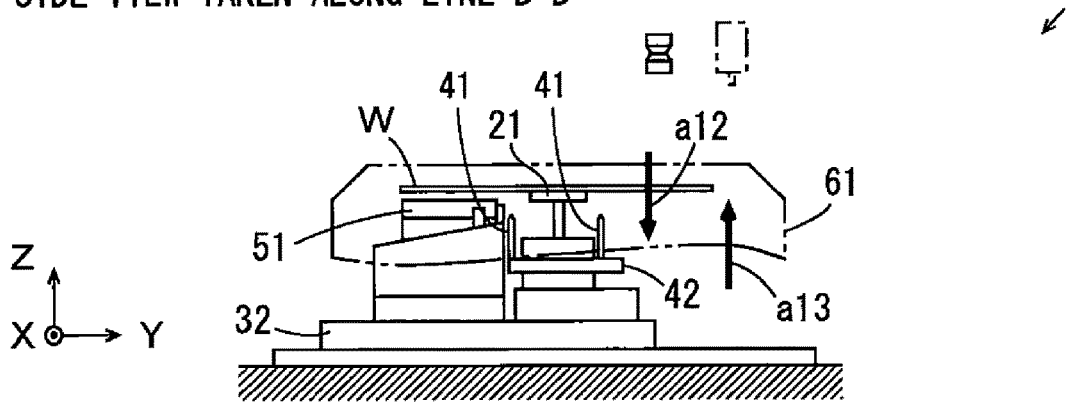

FIG. 15
PLAN VIEW
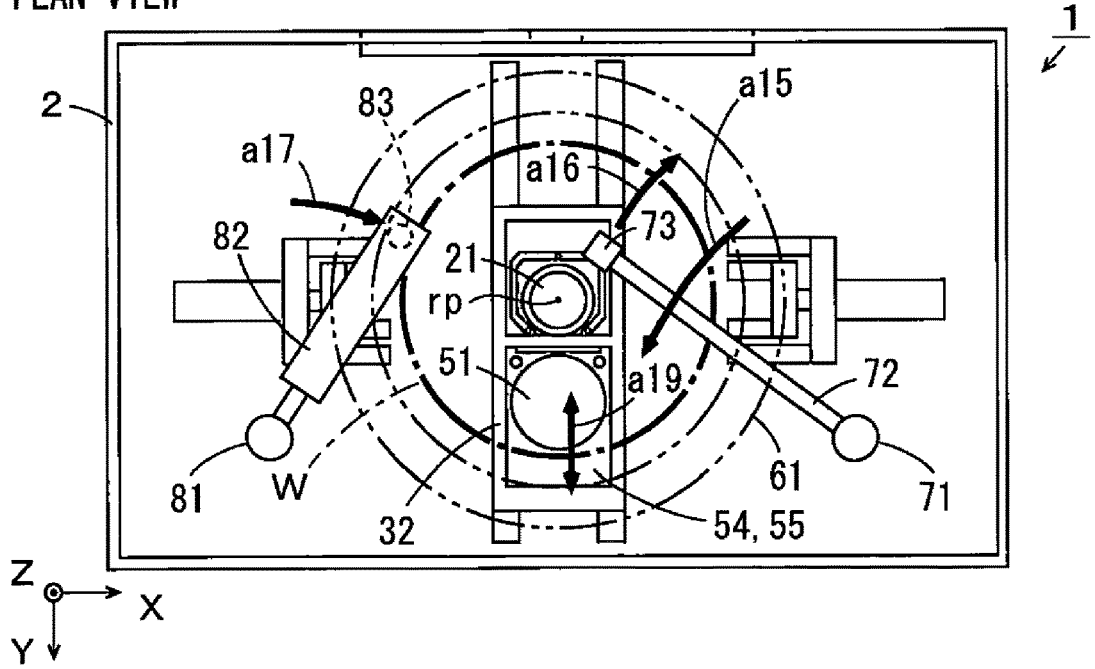
SIDE VIEW TAKEN ALONG LINE A-A
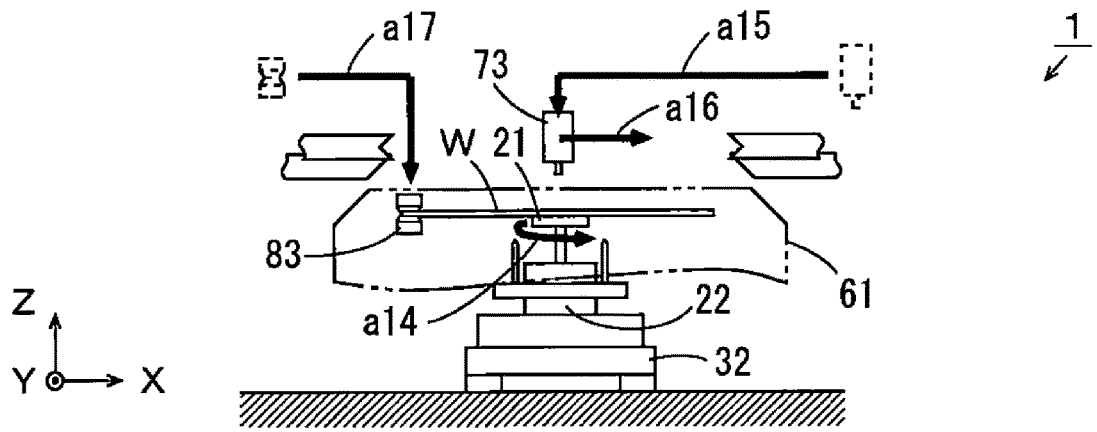
SIDE VIEW TAKEN ALONG LINE B-B
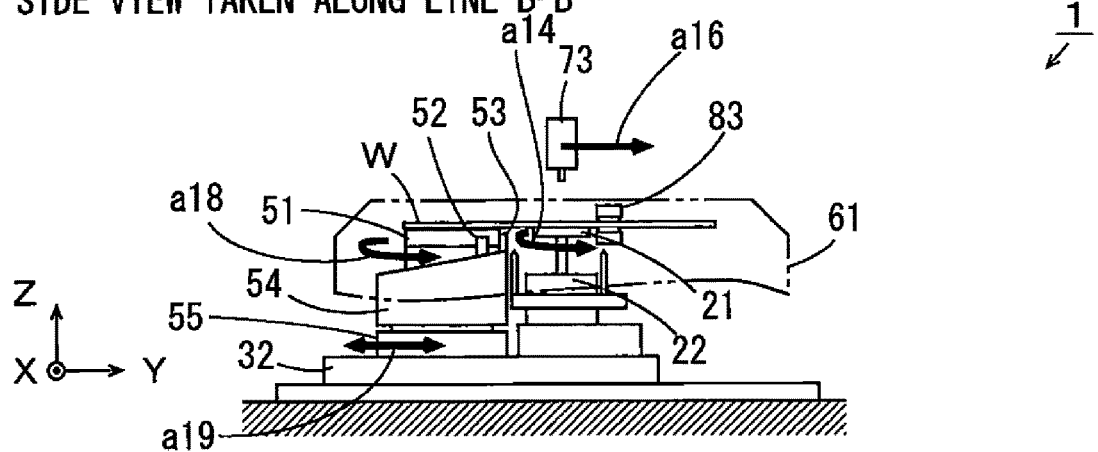

FIG. 16
PLAN VIEW
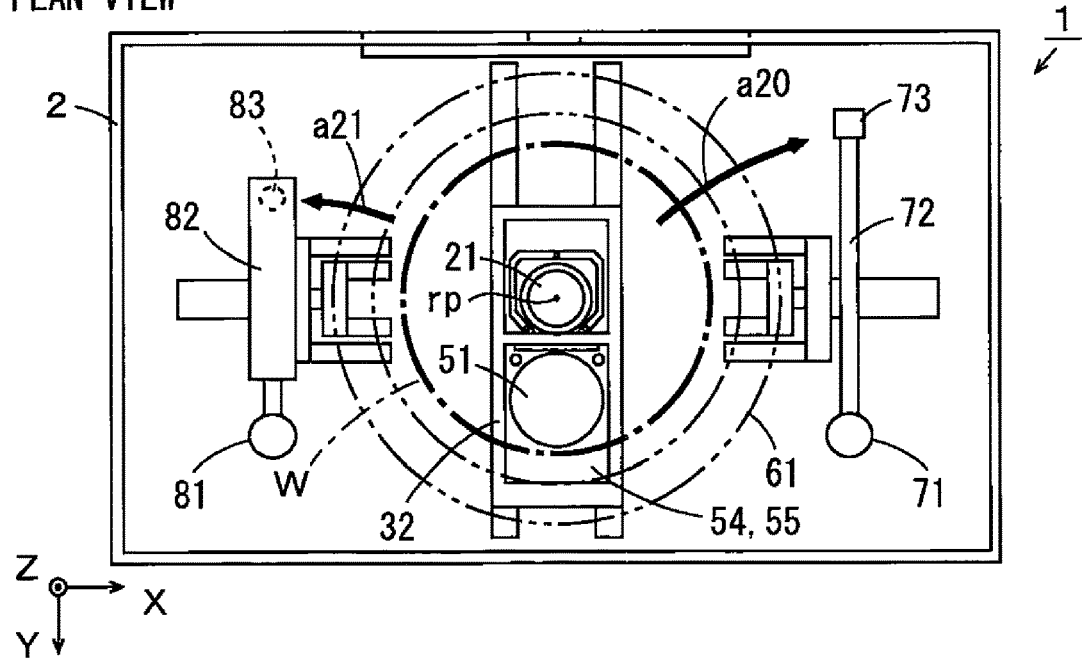
SIDE VIEW TAKEN ALONG LINE A-A
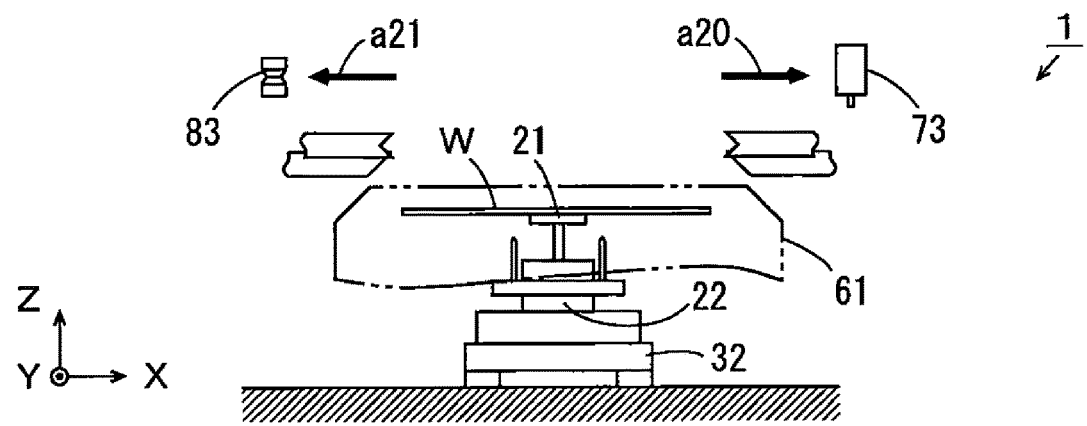
SIDE VIEW TAKEN ALONG LINE B-B
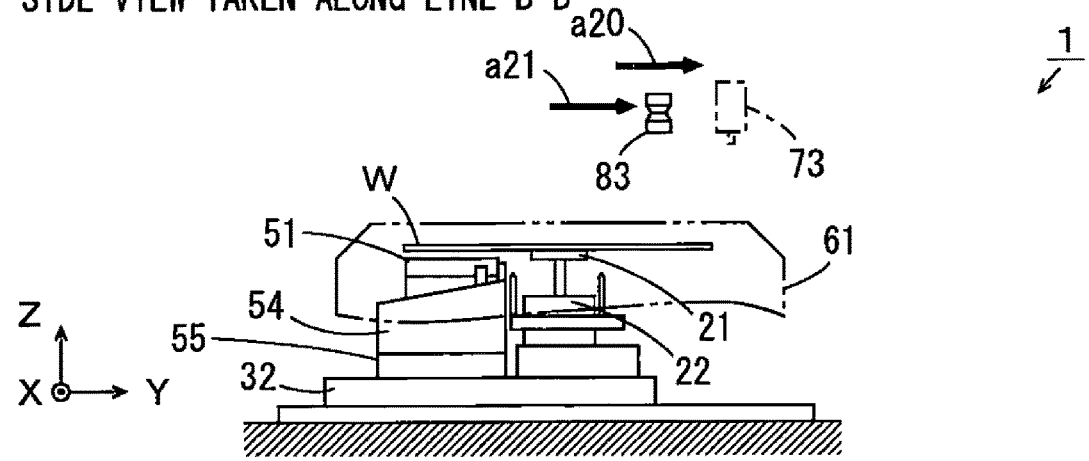

FIG. 17
PLAN VIEW
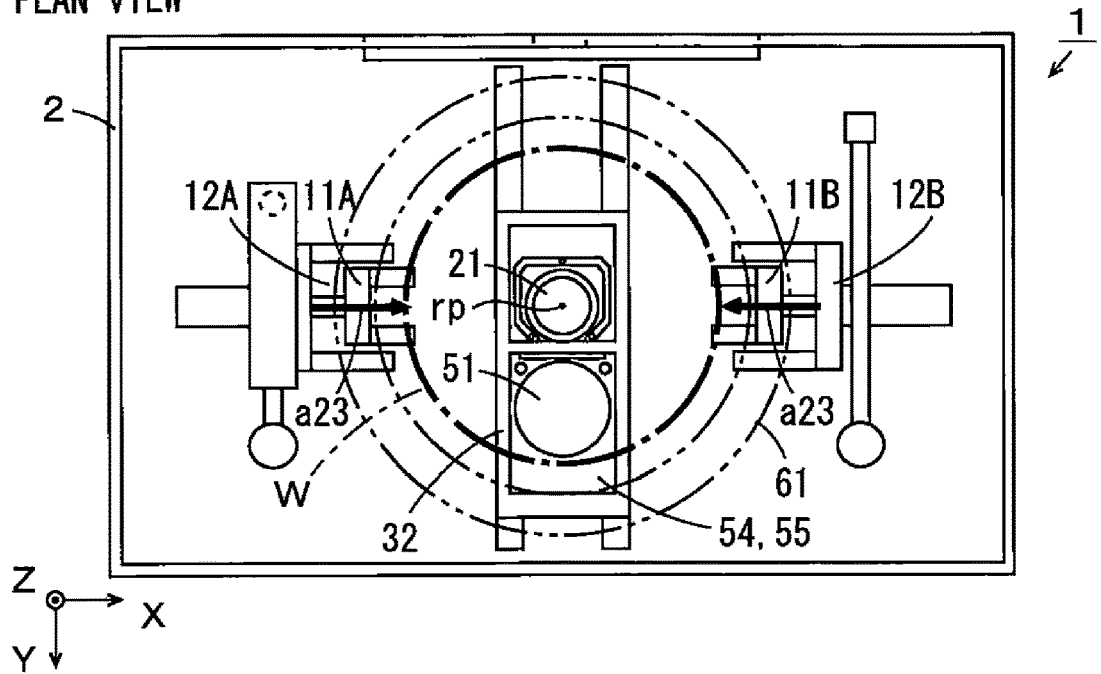
SIDE VIEW TAKEN ALONG LINE A-A
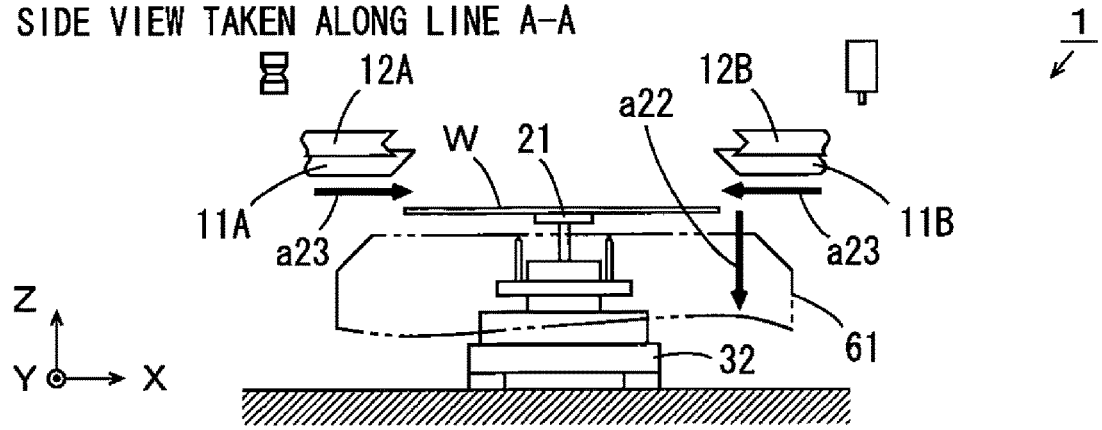
SIDE VIEW TAKEN ALONG LINE B-B
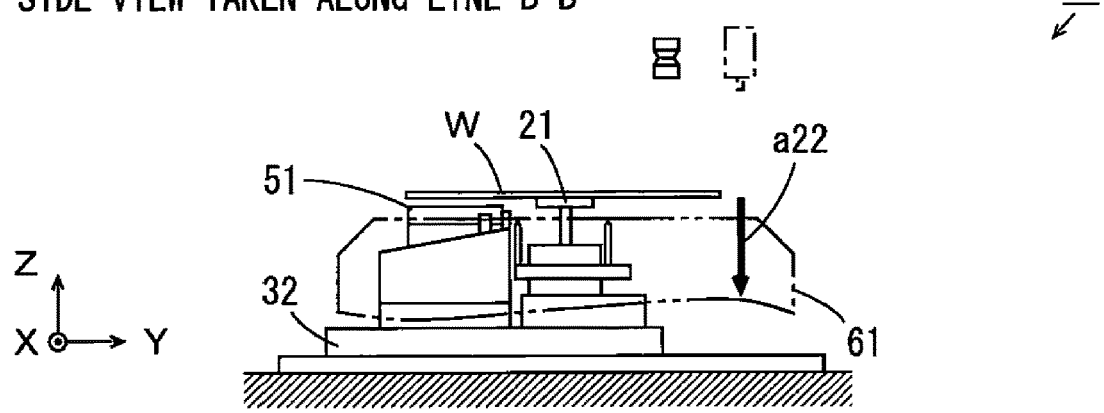

FIG. 18
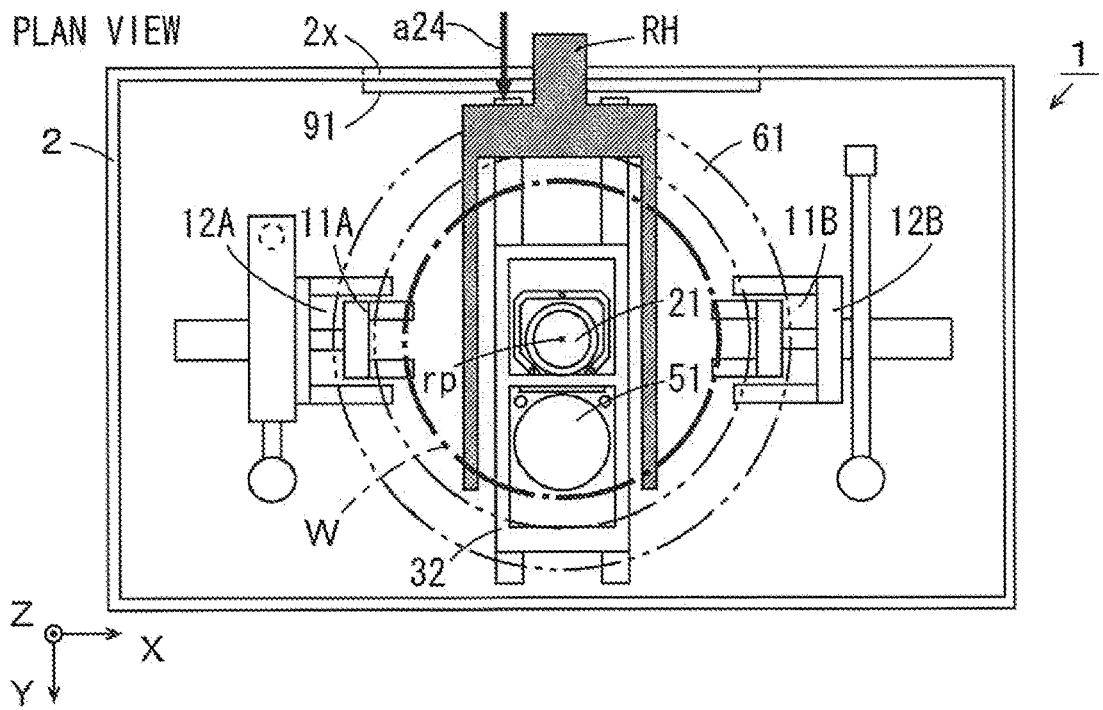
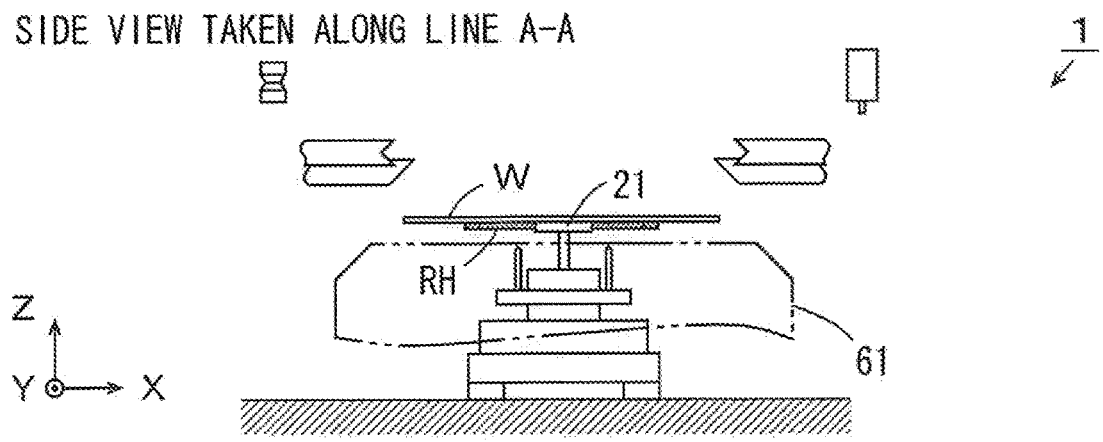
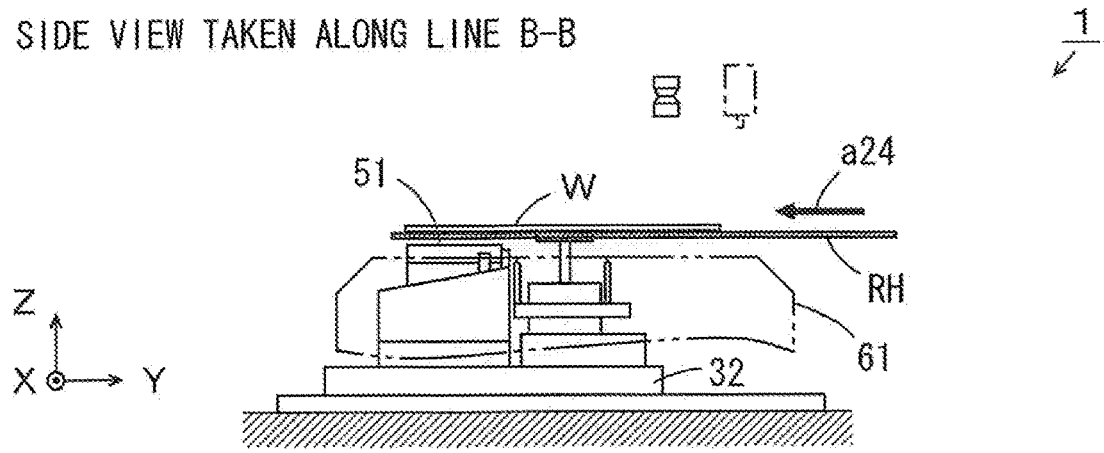

FIG. 19  EXHAUST REGULATION TABLE

| SUBSTRATE HOLDING STATE | SUBSTRATE PROCESSING STATE | TARGET FLOW RATE |
|---|---|---|
| NOT BEING HELD BY UPPER HOLDING DEVICE OR SUCTION HOLDER | — | FIRST FLOW RATE |
| BEING HELD BY UPPER HOLDING DEVICE | NOT BEING PROCESSED, BEING CLEANED AND BEING DRIED | FIRST FLOW RATE |
| BEING HELD BY SUCTION HOLDER | NOT BEING PROCESSED | SECOND FLOW RATE |
| BEING HELD BY SUCTION HOLDER | BEING CLEANED | SECOND FLOW RATE |
| BEING HELD BY SUCTION HOLDER | BEING DRIED | THIRD FLOW RATE |

F I G. 2 0
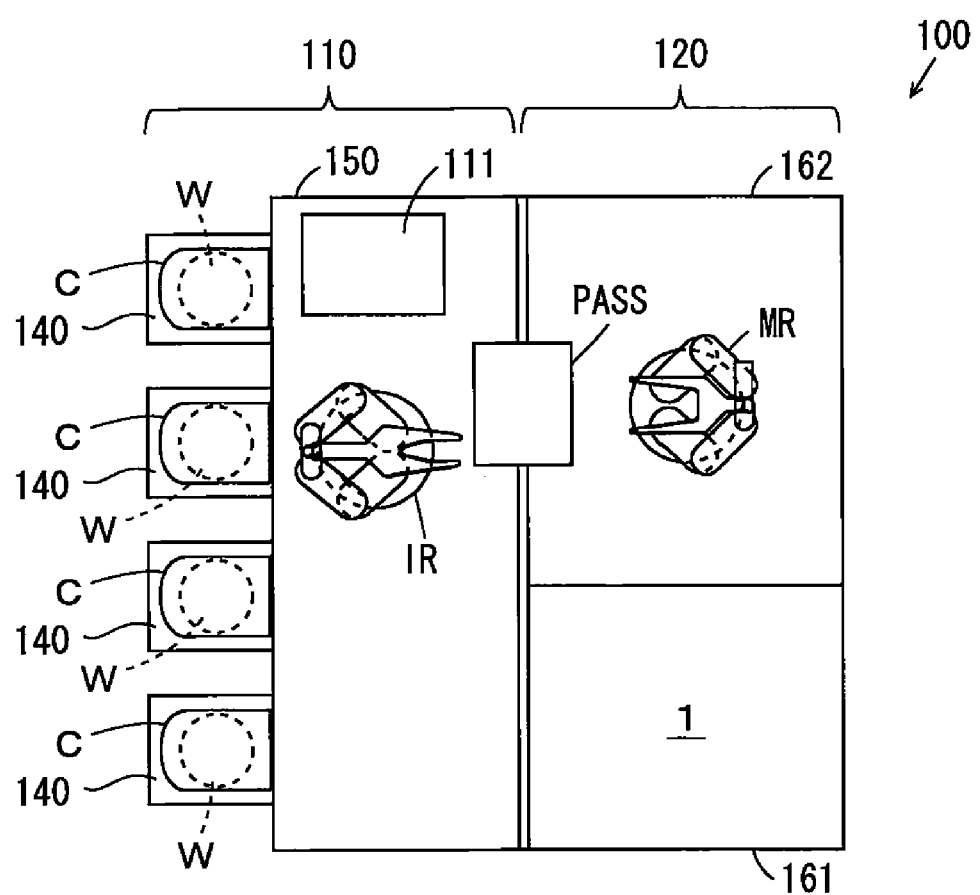

SUBSTRATE CLEANING DEVICE, SUBSTRATE CLEANING SYSTEM, SUBSTRATE PROCESSING SYSTEM, SUBSTRATE CLEANING METHOD AND SUBSTRATE PROCESSING METHOD

BACKGROUND

Technical Field

The present invention relates to a substrate cleaning device, a substrate cleaning system, a substrate processing system, a substrate cleaning method and a substrate processing method.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a substrate cleaning device described in JP 5904169 B2 includes two suction pads for holding a back-surface peripheral portion of a wafer, a spin chuck for holding a back-surface center portion of the wafer and a brush for cleaning a back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

In the substrate cleaning device described in JP 5904169 B2, the suction pad, the spin chuck and the brush, described above, are attached to a box-shaped undercup. The bottom portion of the undercup is provided with one end of an exhaust pipe for exhausting an atmosphere in the substrate cleaning device to the outside of the substrate cleaning device. The other end of the exhaust pipe is connected to exhaust equipment in a factory, for example. It is possible to suppress splashing of mist of a cleaning liquid and splashing of particles in the substrate cleaning device by appropriately exhausting an atmosphere in the substrate cleaning device to the outside of the substrate cleaning device. Thus, high cleanliness in the substrate cleaning device can be maintained.

In the factory, it is possible to clean a larger number of substrates in a short period of time by installing a large number of substrate cleaning devices. However, when an excessive amount of exhaust pipes are connected to the exhaust equipment in the factory because the number of substrate cleaning devices installed in the factory increases, an exhaust amount required in each substrate cleaning device may not be acquired. In this case, high cleanliness in the substrate clean device cannot be maintained. Therefore, the number of substrate cleaning devices that can be installed in the factory is limited based on the exhaust capacity of the exhaust equipment of the factory, for example.

An object of the present invention is to provide a substrate cleaning device, a substrate cleaning system, a substrate processing system, a substrate cleaning method and a substrate processing method that enable maintenance of high cleanliness of inner spaces of a larger number of substrate cleaning devices or a larger number of substrate processing apparatuses with use of exhaust equipment having predetermined exhaust capacity.

(1) A substrate cleaning device according to one aspect of the present invention that cleans a substrate, includes a processing chamber having a processing space capable of containing a substrate, a first substrate holder that holds a substrate in a horizontal attitude without rotating the substrate by abutting against a plurality of portions of the substrate, a second substrate holder that rotates a substrate about an axis extending in an up-and-down direction while holding the substrate in a horizontal attitude by sucking the substrate, a cleaner that cleans a substrate held by the first substrate holder using a cleaning liquid and cleans a substrate held by the second substrate holder using a cleaning liquid before or after the substrate held by the first substrate holder is cleaned, in the processing space, an exhaust system that connects the processing space and exhaust equipment provided outside of the processing chamber to each other, and exhausts gas in the processing space using the exhaust equipment, and an exhaust amount regulator that regulates a flow rate of gas flowing through the exhaust system, such that gas in the processing space is not exhausted or the gas in the processing space is exhausted at a first flow rate when a substrate is held by the first substrate holder, and regulates a flow rate of gas flowing through the exhaust system, such that gas in the processing space is exhausted at a second flow rate that is higher than the first flow rate when a substrate is held by the second substrate holder.

In the substrate cleaning device, the substrate is held by the first substrate holder in a horizontal posture without rotating. In this state, the substrate is cleaned. When the substrate held by the first substrate holder is cleaned, the substrate does not rotate. Thus, the cleaning liquid is unlikely to be splashed from the substrate. Therefore, even in a case in which the gas in the processing space is not exhausted, high cleanliness in the processing space is maintained. Alternatively, even in a case in which the gas in the processing space is exhausted at the first flow rate, which is relatively low, high cleanliness in the processing space is maintained.

Further, in the above-mentioned substrate cleaning device, the substrate is rotated about the axis extending in the up-and-down direction while being held in a horizontal attitude by the second substrate holder. In this state, the substrate is cleaned. When the substrate held by the second substrate holder is cleaned, the substrate is rotated. Thus, the cleaning liquid is likely to be splashed from the substrate. As such, in the above-mentioned substrate cleaning device, the gas in the processing space is exhausted at the second flow rate, which is relatively high. In this case, the cleaning liquid splashed from the substrate is efficiently exhausted from the processing space. Thus, degradation of cleanliness in the processing space is suppressed.

With the above-mentioned configuration, the exhaust capacity of the exhaust equipment required in one substrate cleaning device is regulated over time. Therefore, in a case in which a plurality of substrate cleaning devices are used with respect to one exhaust equipment, it is possible to control the plurality of substrate cleaning devices such that substrates held by the second substrate holders are not cleaned simultaneously. In this case, the level of the exhaust capacity of the exhaust equipment simultaneously required for the plurality of substrate cleaning devices is reduced. Thus, it is possible to maintain high cleanliness of the processing spaces of a larger number of substrate cleaning devices using exhaust equipment having predetermined exhaust capacity.

(2) The second substrate holder may rotate a substrate such that a cleaning liquid used for cleaning is shaken off from the substrate after the substrate held by the second substrate holder is cleaned.

With the above-mentioned configuration, even when the cleaning liquid is shaken off from the substrate, the gas in the processing space is exhausted at the second flow rate, which is relatively high. In this case, the cleaning liquid splashed from the substrate is efficiently exhausted from the processing space. Thus, degradation of cleanliness in the processing space is suppressed.

(3) The second flow rate may include a third flow rate and a fourth flow rate that is higher than the third flow rate, the second substrate holder may rotate a substrate at a first rotation speed during cleaning of the substrate held by the second substrate holder, and may rotate the substrate at a second rotation speed that is higher than the first rotation speed during shake-off of a cleaning liquid from the substrate, and the exhaust amount regulator may regulate a flow rate of gas flowing through the exhaust system such that gas in the processing space is exhausted at the third flow rate during cleaning of a substrate held by the second substrate holder, and may regulate a flow rate of gas flowing through the exhaust system such that gas in the processing space is exhausted at the fourth flow rate during shake-off of a cleaning liquid from a substrate by the second substrate holder.

When the rotation speed of the substrate to which the cleaning liquid adheres is increased, the mist of the cleaning liquid splashed from the substrate is likely to be diffused in the processing space. With the above-mentioned configuration, the second rotation speed of the substrate during shake-off of the cleaning liquid is higher than the first rotation speed of the substrate during cleaning. Therefore, when the cleaning liquid is shaken off from the substrate, the mist of the cleaning liquid is likely to be diffused in the processing space. Even in such a case, when the cleaning liquid is shaken off from the substrate, the gas in the processing space is exhausted at the fourth flow rate that is higher than the first and third flow rates during cleaning of the substrate. Therefore, high cleanliness of the processing space is maintained when the cleaning liquid is shaken off from the substrate.

Further, with the above-mentioned configuration, due to the rotation speed of the substrate, an amount of mist of the cleaning liquid splashed in the processing space during cleaning of the substrate is smaller than an amount of mist of the cleaning liquid splashed in the processing space during shake-off drying of the substrate. Thus, even in a case in which the third flow rate of gas exhausted during cleaning of the substrate is lower than the fourth flow rate of gas exhausted during shake-off of the cleaning liquid from the substrate, gas is exhausted sufficiently such that cleanliness of the processing space is maintained during cleaning of the substrate. Thus, requirement of excessive exhaust capacity with the substrate held by the second substrate holder is prevented.

(4) The substrate cleaning device may further include a processing cup provided to surround the second substrate holder in a plan view, wherein the exhaust system may be provided to exhaust gas in the processing space from a bottom portion of the processing cup.

In this case, the cleaning liquid splashed from the substrate held by the second substrate holder can be received by the processing cup. Further, the mist of the cleaning liquid splashed in the processing cup is smoothly discharged from the bottom portion of the processing cup to the outside of the processing chamber.

(5) The substrate cleaning device may further include a cup driver that supports the processing cup, and may move the processing cup in an up-and-down direction between a first height position at which the processing cup overlaps with a substrate held by the second substrate holder in a side view and a second height position at which the processing cup is located farther downwardly than the substrate held by the second substrate holder in a side view, wherein the cup driver may support the processing cup at the first height position such that the processing cup receives a cleaning liquid splashed from a substrate when the substrate is held by the second substrate holder, and may support the processing cup at the second height position when a substrate is held by the first substrate holder.

In this case, diffusion of the cleaning liquid splashed from the substrate in the processing space with the substrate held by the second substrate holder is reduced. Therefore, degradation of cleanliness in the processing space is suppressed.

(6) A substrate cleaning system according to another aspect of the present invention has a plurality of the above-mentioned substrate cleaning devices and include a cleaning controller, wherein the exhaust equipment is used commonly by the plurality of the substrate cleaning devices, and the cleaning controller controls operations of the plurality of the substrate cleaning devices such that substrates are not held simultaneously by the second substrate holders in the plurality of substrate cleaning devices.

In this case, it is possible to reduce the level of the exhaust capacity of the exhaust equipment simultaneously required with respect to the plurality of substrate cleaning devices. Therefore, it is possible to maintain high cleanliness of the processing spaces of a larger number of substrate cleaning devices by using exhaust equipment having predetermined exhaust capacity.

(7) A substrate cleaning system according to yet another aspect of the present invention has a plurality of the above-mentioned substrate cleaning devices and include a cleaning controller, wherein the exhaust equipment is used commonly by the plurality of the substrate cleaning devices, and the cleaning controller controls operations of the plurality of the substrate cleaning devices such that a cleaning liquid is not shaken off simultaneously from substrates in the plurality of the substrate cleaning devices.

In this case, it is possible to reduce the level of the exhaust capacity of the exhaust equipment simultaneously required with respect to the plurality of substrate cleaning devices. Therefore, it is possible to maintain high cleanliness of the processing spaces of a larger number of substrate cleaning devices by using exhaust equipment having predetermined exhaust capacity.

(8) A substrate processing system according to yet another aspect of the present invention performs a predetermined process on a substrate, and includes a plurality of substrate processing apparatuses, and a processing controller that controls the plurality of substrate processing apparatuses, wherein each of the plurality of substrate processing apparatuses includes a processing chamber having a processing space capable of containing a substrate, a processor that performs a first process on a substrate and performs a second process on the substrate before the first process or after the first process in the processing space, an exhaust system that connects the processing space and exhaust equipment provided outside of the processing chamber to each other, and exhausts gas in the processing space using the exhaust equipment, and an exhaust amount regulator that regulates a flow rate of gas flowing through the exhaust system such that gas in the processing space is not exhausted or the gas in the processing space is exhausted at a first flow rate during the first process and the gas in the processing space is exhausted at a second flow rate that is higher than the first flow rate during the second process, and the processing controller controls operations of the plurality of substrate processing apparatuses such that the second process is not performed simultaneously and respectively on a plurality of substrates in the plurality of substrate processing apparatuses.

In each of the plurality of substrate processing apparatuses, gas in the processing space is not exhausted or is exhausted at the first flow rate, which is relatively low, during the first process of the substrate. Meanwhile, the gas in the processing space is exhausted at the second flow rate, which is relatively high, during the second process of the substrate.

In the plurality of substrate processing apparatuses, the second process is not simultaneously performed on a plurality of substrates. In this case, the level of the exhaust capacity of the exhaust equipment simultaneously required with respect to the plurality of substrate processing apparatuses is reduced. Thus, it is possible to maintain high cleanliness of the processing spaces of a larger number of substrate processing apparatuses by using exhaust equipment having predetermined exhaust capacity.

(9) A substrate cleaning method according to yet another aspect of the present invention of cleaning a substrate includes holding a substrate in a horizontal attitude without rotating the substrate using a first substrate holder that abuts against a plurality of portions of the substrate in a processing space formed by a processing chamber, cleaning a substrate held by the first substrate holder using a cleaning liquid, rotating a substrate about an axis extending in an up-and-down direction while holding the substrate in a horizontal attitude using a second substrate holder that sucks the substrate in the processing space, cleaning a substrate held by the second substrate holder using a cleaning liquid, regulating a flow rate of gas flowing through the exhaust system when a substrate is held by the first substrate holder such that gas in the processing space is not exhausted or the gas in the processing space is exhausted at a first flow rate to outside of the processing chamber through an exhaust system using exhaust equipment provided outside of the processing chamber, and regulating a flow rate of gas flowing through the gas exhaust system when a substrate is held by the second substrate holder such that gas in the processing space is exhausted to outside of the processing chamber through an exhaust system using the exhaust equipment at a second flow rate that is higher than the first flow rate.

With the substrate cleaning method, the substrate is held by the first substrate holder in a horizontal posture without rotating. In this state, the substrate is cleaned. When the substrate held by the first substrate holder is cleaned, the substrate does not rotate. Thus, the cleaning liquid is unlikely to be splashed from the substrate. Therefore, even in a case in which the gas in the processing space is not exhausted, high cleanliness in the processing space is maintained. Alternatively, even in a case in which the gas in the processing space is exhausted at the first flow rate, which is relatively low, high cleanliness in the processing space is maintained.

Further, with the above-mentioned substrate cleaning method, the substrate is rotated about the axis extending in the up-and-down direction while being held in a horizontal attitude by the second substrate holder. In this state, the substrate is cleaned. When the substrate held by the second substrate holder is cleaned, the substrate is rotated. Thus, the cleaning liquid is likely to be splashed from the substrate. As such, with the above-mentioned substrate cleaning method, the gas in the processing space is exhausted at the second flow rate, which is relatively high. In this case, the cleaning liquid splashed from the substrate is efficiently exhausted from the processing space. Thus, degradation of cleanliness in the processing space is suppressed.

The processing chamber, the first substrate holder, the second substrate holder and the exhaust system, described above, constitute one substrate cleaning device, for example. With the above-mentioned method, the exhaust capacity of the exhaust equipment required in one substrate cleaning device is regulated over time. Therefore, in a case in which a plurality of substrate cleaning devices are used with respect to one exhaust equipment, it is possible to control the plurality of substrate cleaning devices such that substrates held by the second substrate holders are not cleaned simultaneously. In this case, the level of the exhaust capacity of the exhaust equipment simultaneously required with respect to the plurality of substrate cleaning devices is reduced. Thus, it is possible to maintain high cleanliness of the processing spaces of a larger number of substrate cleaning devices by using exhaust equipment having predetermined exhaust capacity.

(10) The substrate cleaning method may further include rotating a substrate such that a cleaning liquid used for cleaning is shaken off from the substrate after the cleaning of the substrate held by the second substrate holder.

With the above-mentioned configuration, even when the cleaning liquid is shaken off from the substrate, the gas in the processing space is exhausted at the second flow rate, which is relatively high. In this case, the cleaning liquid splashed from the substrate is efficiently exhausted from the processing space. Thus, degradation of cleanliness in the processing space is suppressed.

(11) The second flow rate may include a third flow rate and a fourth flow rate that is higher than the third flow rate, the cleaning a substrate held by the second substrate holder using a cleaning liquid may include rotating the substrate held by the second substrate holder at a first rotation speed during the cleaning, the rotating a substrate such that a cleaning liquid is shaken off from the substrate may include rotating a substrate held by the second substrate holder at a second rotation speed that is higher than the first rotation speed during the shake-off of a cleaning liquid from the substrate, and the regulating a flow rate of gas flowing through the exhaust system when a substrate is held by the second substrate holder includes regulating a flow rate of gas flowing through the exhaust system such that gas in the processing space is exhausted at the third flow rate during cleaning of a substrate held by the second substrate holder, and regulating a flow rate of gas flowing through the exhaust system such that gas in the processing space is exhausted at the fourth flow rate during shake-off of a cleaning liquid from a substrate by the second substrate holder.

When the rotation speed of the substrate to which the cleaning liquid adheres is increased, the mist of the cleaning liquid splashed from the substrate is likely to be diffused in the processing space. With the above-mentioned configuration, the second rotation speed of the substrate during shake-off of the cleaning liquid is higher than the first rotation speed of the substrate during cleaning. Therefore, when the cleaning liquid is shaken off from the substrate, the mist of the cleaning liquid is likely to be diffused in the processing space. Even in such a case, when the cleaning liquid is shaken off from the substrate, the gas in the processing space is exhausted at the fourth flow rate that is higher than the first and third flow rates during cleaning of the substrate. Therefore, high cleanliness of the processing space is maintained when the cleaning liquid is shaken off from the substrate.

Further, with the above-mentioned configuration, due to the rotation speed of the substrate, an amount of mist of the cleaning liquid splashed in the processing space during cleaning of the substrate is smaller than an amount of mist of the cleaning liquid splashed in the processing space during shake-off drying of the substrate. Thus, even in a case in which the third flow rate of gas exhausted during cleaning of the substrate is lower than the fourth flow rate of gas exhausted during shake-off of the cleaning liquid from the substrate, gas is exhausted sufficiently such that cleanliness of the processing space is maintained during cleaning of the substrate. Thus, requirement of excessive exhaust capacity with the substrate held by the second substrate holder is prevented.

(12) A processing cup may be provided to surround the second substrate holder in a plan view, and the regulating a flow rate of gas flowing through the exhaust system when a substrate is held by the first substrate holder and the regulating a flow rate of gas flowing through the exhaust system when a substrate is held by the second substrate holder may include exhausting gas in the processing space from a bottom portion of the processing cup.

In this case, the cleaning liquid splashed from the substrate held by the second substrate holder can be received by the processing cup. Further, the mist of the cleaning liquid splashed in the processing cup is smoothly discharged from the bottom portion of the processing cup to the outside of the processing chamber.

(13) The substrate cleaning method may further include supporting the processing cup and moving the processing cup in an up-and-down direction between a first height position at which the processing cup overlaps with a substrate held by the second substrate holder in a side view and a second height position at which the processing cup is located farther downwardly than the substrate held by the second substrate holder in a side view, wherein the supporting and moving the processing up in an up-and-down direction may include supporting the processing cup at the first height position such that the processing cup receives a cleaning liquid splashed from a substrate when the substrate is held by the second substrate holder, and supporting the processing cup at the second height position when a substrate is held by the first substrate holder.

In this case, diffusion of the cleaning liquid splashed from the substrate in the processing space with the substrate held by the second substrate holder is suppressed. Therefore, degradation of cleanliness in the processing space is suppressed.

(14) A substrate cleaning method according to yet another aspect of the present invention of cleaning a plurality of substrates, includes controlling a plurality of substrate cleaning devices, wherein each of the plurality of substrate cleaning devices includes a processing chamber having a processing space capable of containing a substrate, a first substrate holder that holds a substrate in a horizontal attitude without rotating the substrate by abutting against a plurality of portion of the substrate, a second substrate holder that rotates a substrate about an axis extending in an up-and-down direction while holding the substrate in a horizontal attitude by sucking the substrate, a cleaner that cleans a substrate held by the first substrate holder using a cleaning liquid and cleans a substrate held by the second substrate holder using a cleaning liquid before or after the substrate held by the first substrate holder is cleaned, in the processing space, an exhaust system that connects the processing space and exhaust equipment provided outside of the processing chamber to each other, and exhausts gas in the processing space using the exhaust equipment, and an exhaust amount regulator that regulates a flow rate of gas flowing through the exhaust system, such that gas in the processing space is not exhausted or the gas in the processing space is exhausted at a first flow rate when a substrate is held by the first substrate holder, and regulates a flow rate of gas flowing through the exhaust system, such that gas in the processing space is exhausted at a second flow rate that is higher than the first flow rate when a substrate is held by the second substrate holder, the exhaust equipment is used commonly by the plurality of substrate cleaning devices, and the controlling a plurality of substrate cleaning devices includes controlling operations of the plurality of substrate cleaning devices such that substrates are not held simultaneously by the second substrate holders in the plurality of substrate cleaning devices.

With the substrate cleaning method, it is possible to reduce the level of the exhaust capacity of the exhaust equipment simultaneously required with respect to the plurality of substrate cleaning devices. Therefore, it is possible to maintain high cleanliness of the processing spaces of a larger number of substrate cleaning devices by using exhaust equipment having predetermined exhaust capacity.

(15) A substrate cleaning method according to yet another aspect of the present invention of cleaning a plurality of substrates, includes controlling a plurality of substrate cleaning devices, wherein each of the plurality of substrate cleaning devices includes a processing chamber having a processing space capable of containing a substrate, a first substrate holder that holds a substrate in a horizontal attitude without rotating the substrate by abutting against a plurality of portion of the substrate, a second substrate holder that rotates a substrate about an axis extending in an up-and-down direction while holding the substrate in a horizontal attitude by sucking the substrate, a cleaner that cleans a substrate held by the first substrate holder using a cleaning liquid and cleans a substrate held by the second substrate holder using a cleaning liquid before or after the substrate held by the first substrate holder is cleaned, in the processing space, an exhaust system that connects the processing space and exhaust equipment provided outside of the processing chamber to each other, and exhausts gas in the processing space using the exhaust equipment, and an exhaust amount regulator that regulates a flow rate of gas flowing through the exhaust system, such that gas in the processing space is not exhausted or the gas in the processing space is exhausted at a first flow rate when a substrate is held by the first substrate holder, and regulates a flow rate of gas flowing through the exhaust system, such that gas in the processing space is exhausted at a second flow rate that is higher than the first flow rate when a substrate is held by the second substrate holder, the second substrate holder rotates a substrate such that a cleaning liquid used for cleaning is shaken off from the substrate after the cleaning of the substrate held by the second substrate holder, the exhaust amount regulator further regulates a flow rate of gas flowing through the exhaust system such that gas in the processing liquid is exhausted at the third flow rate during cleaning of a substrate held by the second substrate holder and gas in the processing space is exhausted at the fourth flow rate during shake-off of a cleaning liquid from a substrate held by the second substrate holder, the exhaust equipment is used commonly by the plurality of substrate cleaning devices, and the controlling a plurality of substrate cleaning devices includes controlling operations of the plurality of substrate cleaning devices such that a cleaning liquid is not shaken off simultaneously from substrates in the plurality of substrate cleaning devices.

With the substrate cleaning method, it is possible to reduce the level of the exhaust capacity of the exhaust equipment simultaneously required with respect to the plurality of substrate cleaning devices. Therefore, it is possible to maintain high cleanliness of the processing spaces of a larger number of substrate cleaning devices by using exhaust equipment having predetermined exhaust capacity.

(16) A substrate processing method according to yet another aspect of the present invention of performing a predetermined process on a plurality of substrates, includes controlling a plurality of substrate processing apparatuses, wherein each of the plurality of substrate processing apparatuses includes a processing chamber having a processing space capable of containing a substrate, a processor that performs a first process on a substrate and performs a second process on a substrate before the first process or after the first process in the processing space, an exhaust system that connects the processing space and exhaust equipment provided outside of the processing chamber to each other and exhausts gas in the processing space using the exhaust equipment, and an exhaust amount regulator that regulates a flow rate of gas flowing through the exhaust system such that gas in the processing space is not exhausted or gas in the processing space is exhausted at a first flow rate during the first process, and the gas in the processing space is exhausted at a second flow rate that is higher than the first flow rate during the second process, and the controlling a plurality of substrate processing apparatuses includes controlling operations of the plurality of substrate processing apparatuses such that the second process is not performed simultaneously on a plurality of respective substrates in the plurality of substrate processing apparatuses.

In each of the plurality of above-mentioned substrate processing apparatuses, the gas in the processing space is not exhausted or is exhausted at the first flow rate, which is relatively low, during the first process of the substrate. Meanwhile, the gas in the processing space is exhausted at the second flow rate, which is relatively high, during the second process of the substrate.

In the plurality of substrate processing apparatuses, the second process is not simultaneously performed on a plurality of substrates. In this case, the level of the exhaust capacity of the exhaust equipment simultaneously required with respect to the plurality of substrate processing apparatuses is reduced. Thus, it is possible to maintain high cleanliness of the processing spaces of a larger number of substrate processing apparatuses by using exhaust equipment having predetermined exhaust capacity.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 7 is a schematic diagram for explaining the schematic operation of the substrate cleaning device of FIG. 1;

FIG. 8 is a schematic diagram for explaining the schematic operation of the substrate cleaning device of FIG. 1;

FIG. 9 is a schematic diagram for explaining the schematic operation of the substrate cleaning device of FIG. 1;

FIG. 10 is a schematic diagram for explaining the schematic operation of the substrate cleaning device of FIG. 1;

FIG. 11 is a schematic diagram for explaining the schematic operation of the substrate cleaning device of FIG. 1;

FIG. 12 is a schematic diagram for explaining the schematic operation of the substrate cleaning device of FIG. 1;

FIG. 13 is a schematic diagram for explaining the schematic operation of the substrate cleaning device of FIG. 1;

FIG. 14 is a schematic diagram for explaining the schematic operation of the substrate cleaning device of FIG. 1;

FIG. 15 is a schematic diagram for explaining the schematic operation of the substrate cleaning device of FIG. 1;

FIG. 16 is a schematic diagram for explaining the schematic operation of the substrate cleaning device of FIG. 1;

FIG. 17 is a schematic diagram for explaining the schematic operation of the substrate cleaning device of FIG. 1;

FIG. 18 is a schematic diagram for explaining the schematic operation of the substrate cleaning device of FIG. 1;

FIG. 19 is a diagram showing one example of an exhaust regulation table;

FIG. 20 is a schematic plan view showing one example of a substrate cleaning system including a plurality of substrate cleaning devices;

DETAILED DESCRIPTION

A substrate cleaning device, a substrate cleaning system, a substrate processing system, a substrate cleaning method and a substrate processing method according to embodiments of the present invention will be described below with reference to drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar cell, or the like. Further, as for a substrate to be used in the present embodiment, at least part of the substrate has a circular outer periphery. For example, the outer periphery except for a notch for positioning is circular.

1. Configuration of Substrate Cleaning Device

Figure 1:
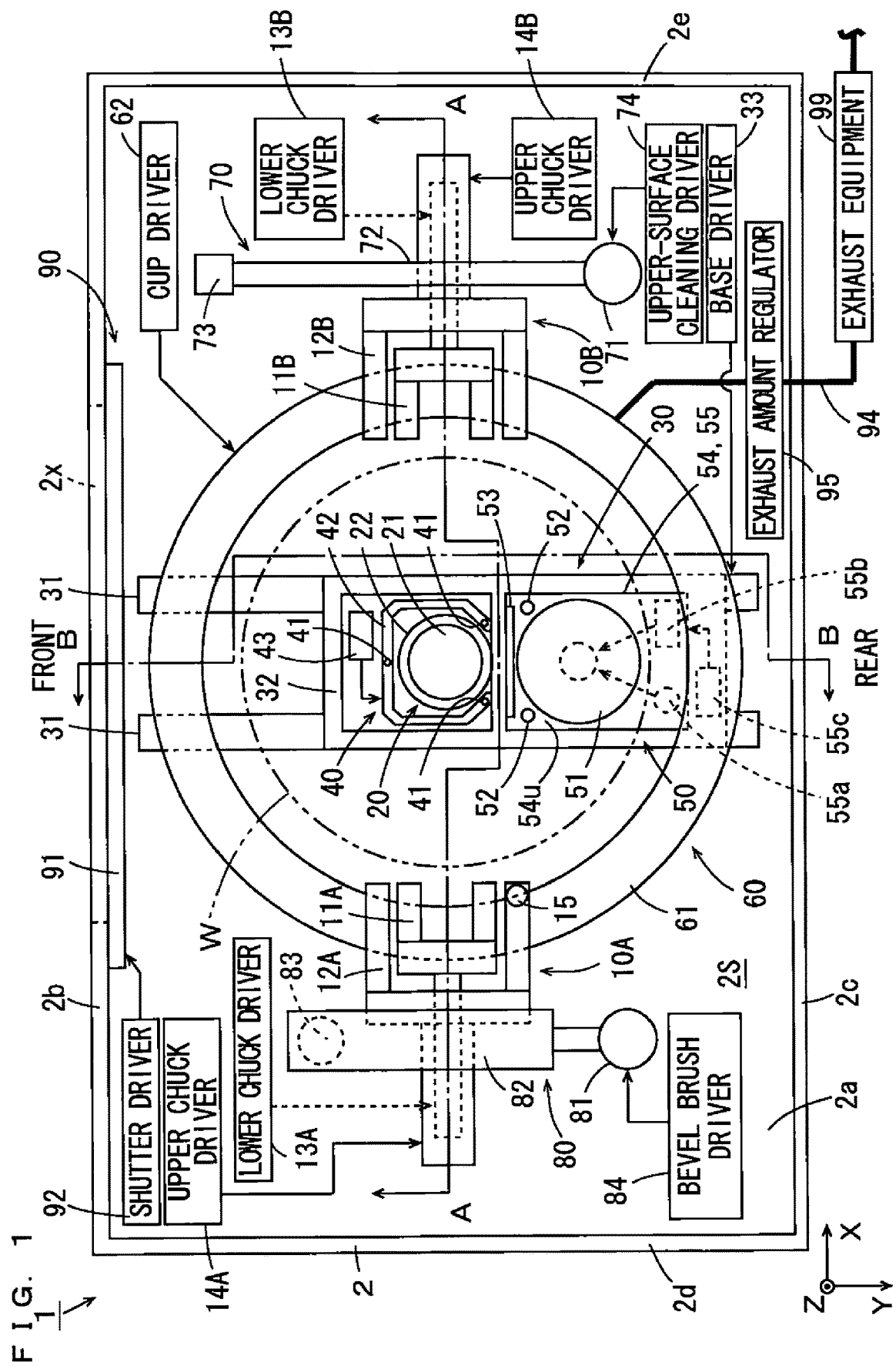
FIG. 1 is a schematic plan view of a substrate cleaning device according to one embodiment of the present invention.
Figure 2:
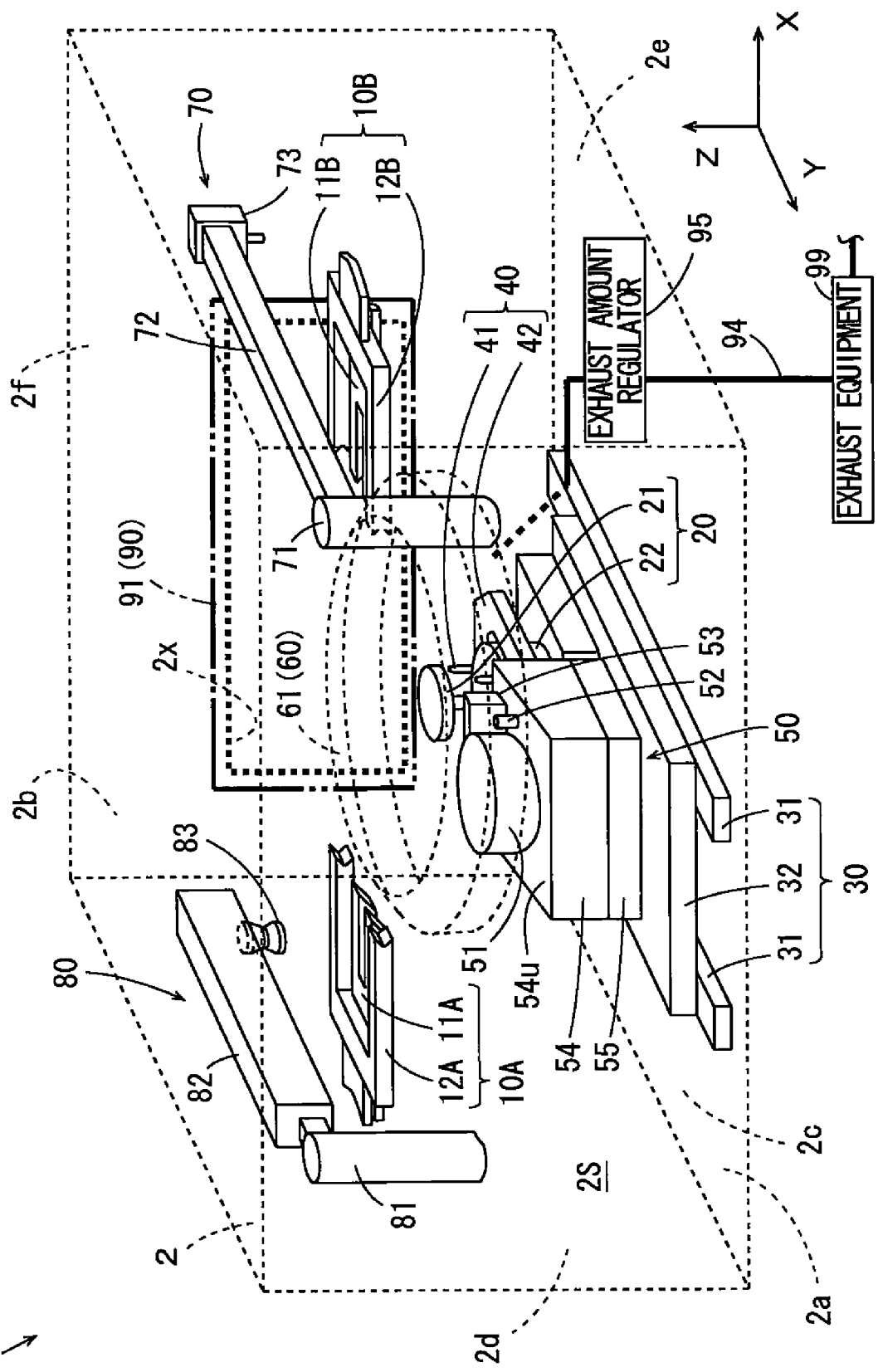
FIG. 2 is an external perspective view showing the inner configuration of the substrate cleaning device of FIG. 1.

FIG. 1 is a schematic plan view of a substrate cleaning device according to one embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from the four sides of the bottom surface portion 2a. Further, the unit casing 2 has a top wall portion 2f (FIG. 2) that connects the four sidewall portions 2b, 2c, 2d, 2e to one another. The sidewall portions 2b, 2c are opposite to each other, and the sidewall portions 2d, 2e are opposite to each other. The space surrounded by the four sidewall portions 2b, 2c, 2d, 2e functions as a processing space 2S in which a predetermined process (a cleaning process in the present example) is performed on a substrate W.

A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

The opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In the following description, a region that is to be sucked by the suction surface of the suction holder 21 in the lower surface of a substrate W when the substrate W is held by suction by the suction holder 21 is referred to as a lower-surface center region. On the other hand, a region, surrounding the lower-surface center region, in the lower surface of a substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in a plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than ⅓ of the diameter of a substrate W and smaller than ½ of the diameter of a substrate W. The diameter of a substrate W is 300 mm, for example.

The lower-surface brush 51 has a cleaning surface that can come into contact with the lower surface of a substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 6) is connected to the liquid nozzles 52. The lower-surface cleaning liquid supplier 56 supplies a cleaning liquid to the liquid nozzles 52. When a substrate W is cleaned by the lower-surface brush 51, the liquid nozzles 52 discharge the cleaning liquid supplied from the lower-surface cleaning liquid supplier 56 to the lower surface of the substrate W. In the present embodiment, pure water is used as the cleaning liquid to be supplied to the liquid nozzles 52.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 57 (FIG. 6) is connected to the gas injector 53. The injection gas supplier 57 supplies gas to the gas injector 53. In the present embodiment, an inert gas such as a nitrogen gas is used as the gas to be supplied to the gas injector 53. The gas injector 53 injects the gas supplied from the injection gas supplier 57 to the lower surface of a substrate W during cleaning of the substrate W by the lower-surface brush 51 and during drying of the lower surface of a substrate W, as described below. In this case, a strip-shaped gas curtain extending in the X direction is formed between the lower-surface brush 51 and the suction holder 21.

The lower-surface brush rotation driver 55a includes a motor, and rotates the lower-surface brush 51 during cleaning of a substrate W by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2a. The cup device 60 includes a cup 61 and a cup driver 62. The cup 61 is provided to surround the lower holding device 20 and the base device 30 in a plan view, and be liftable and lowerable. In FIG. 2, the cup 61 is indicated by the dotted lines. The cup driver 62 moves the cup 61 between a lower cup position and an upper cup position in accordance with which portion of the lower surface of a substrate W is to be cleaned by the lower-surface brush 51. The lower cup position is a height position at which the upper end portion of the cup 61 is located farther downwardly than a substrate W held by suction by the suction holder 21. That is, with the cup 61 located at the lower cup position, the cup 61 is located farther downwardly than the substrate W held by the suction holder 21 in a side view. Further, the upper cup position is a height position at which the upper end portion of the cup 61 is located farther upwardly than the suction holder 21. That is, with the cup 61 located at the upper cup position, the cup 61 overlaps with a substrate W held by the suction holder 21 in a side view.

One end of an exhaust system 94 extending to the outside of the substrate cleaning device 1 is connected to the bottom portion of the cup 61. The other end of the exhaust system 94 is connected to exhaust equipment 99 of a factory provided outside of the substrate cleaning device 1.

The exhaust system 94 is mainly constituted by a pipe. The exhaust system 94 may include a fluid-related device such as a joint or a valve in addition to the pipe. In the substrate cleaning device 1, an exhaust amount regulator 95 is provided in a portion of the exhaust system 94. Details of the exhaust amount regulator 95 will be described below. The exhaust equipment 99 includes an exhaust fan, for example and sucks air in the exhaust system 94 to exhaust the air to the outside of the exhaust system 94. The exhaust equipment 99 has predetermined exhaust capacity (an amount of gas that can be exhausted per unit time). When the exhaust equipment 99 is operated, the atmospheric pressure in the internal space of the exhaust system 94 is lower than that in the processing space 2S. Therefore, an atmosphere in the processing space 2S of the substrate cleaning device 1 is sucked through the exhaust system 94 to be exhausted to the outside of the substrate cleaning device 1.

Figure 3:
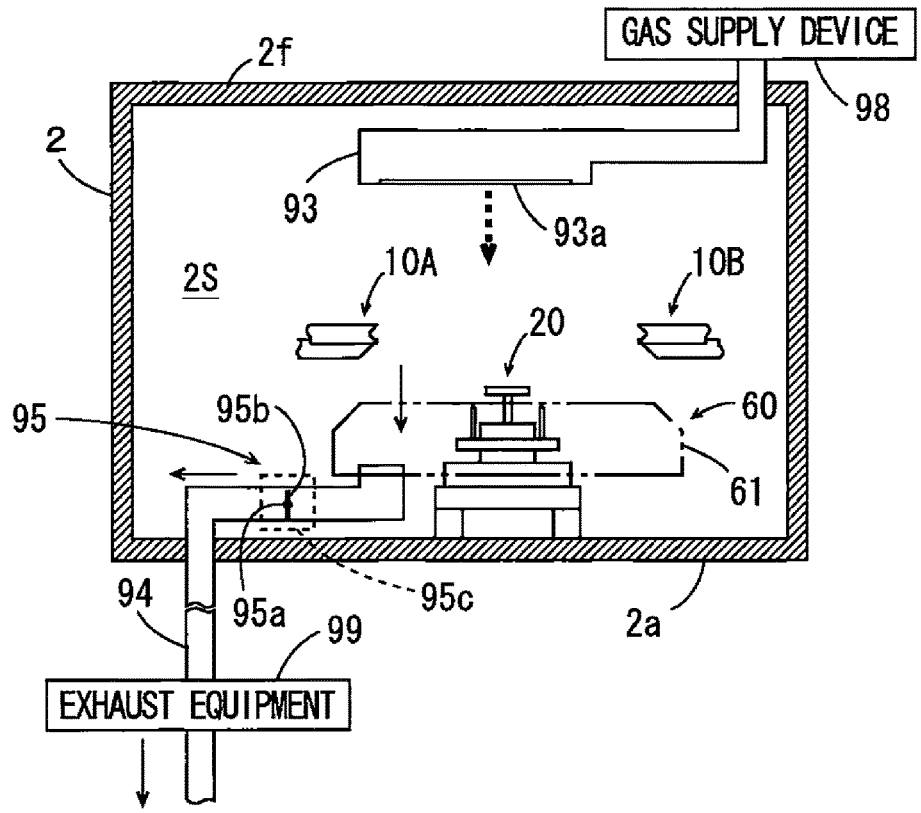
FIG. 3 is a schematic side view of the substrate cleaning device for explaining details of an exhaust amount regulator.
Figure 4:
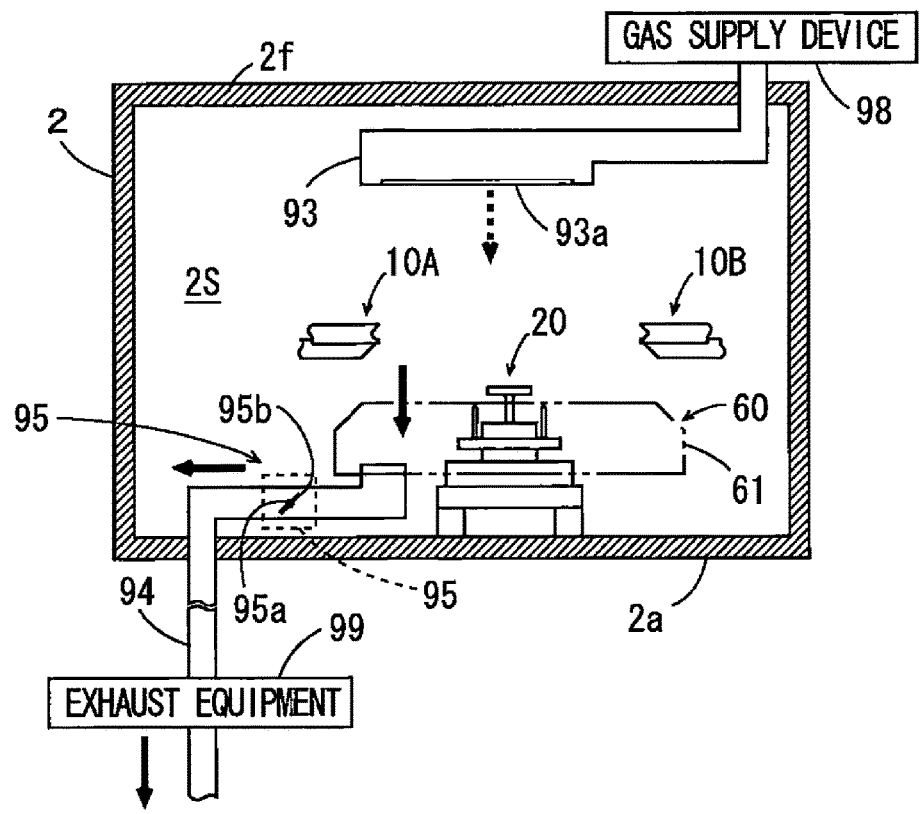
FIG. 4 is a schematic side view of the substrate cleaning device for explaining details of the exhaust amount regulator.
Figure 5:
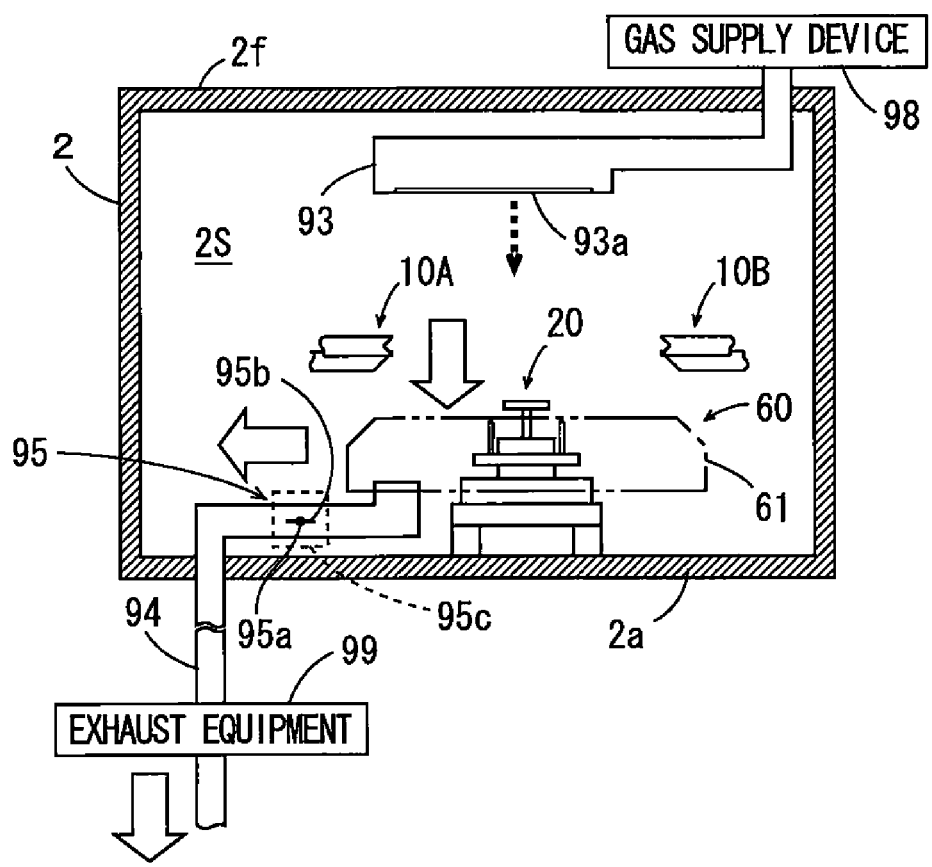
FIG. 5 is a schematic side view of the substrate cleaning device for explaining details of the exhaust amount regulator.

FIGS. 3 to 5 are schematic side views of the substrate cleaning device 1 for explaining details of the exhaust amount regulator 95. As shown in FIG. 3, in the processing space 2S of the substrate cleaning device 1, a gas supply duct 93 is provided in the vicinity of the top wall portion 2f. Clean air is supplied to the gas supply duct 93 from a gas supply device 98 provided outside of the unit casing 2. The gas supply duct 93 has a gas outlet port 93a that opens downwardly. Clean air that has been supplied to the gas supply duct 93 is supplied from the gas outlet port 93a toward the bottom surface portion 2a as indicated by the thick dotted arrow in FIG. 3. Thus, a downward flow of clean air is generated in the processing space 2S.

The exhaust amount regulator 95 includes a rotation shaft 95a, a damper 95b and an actuator 95c, and is provided in a portion of the exhaust system 94 in the processing space 2S. More specifically, the rotation shaft 95a is fixed to an inner portion of the pipe of the exhaust system 94. The damper 95b is attached to the rotation shaft 95a so as to be rotatable inside of the pipe of the exhaust system 94.

In FIGS. 3 to 5, in order to facilitate understanding of the structure of the exhaust amount regulator 95, the rotation shaft 95a and the damper 95b provided inside of the exhaust system 94 are indicated by solid lines. The actuator 95c rotates the damper 95b among a plurality (three in this example) of predetermined rotation angular positions with respect to the rotation shaft 95a based on the control of a controller 9 (FIG. 6), described below. Further, the actuator 95c holds the damper 95b at any one rotation angular position among the plurality of predetermined rotation angular positions. In the present embodiment, a first rotation angular position, a second rotation angular position and a third rotation angular position are defined as the predetermined three rotation angular positions.

In the example of FIG. 3, the damper 95b being held at the first rotation angular position is shown. As shown in FIG. 3, the damper 95b closes a large portion of the gas flow path in the exhaust system 94 while being located at the first rotation angular position. At this time, a subtle clearance is formed between the inner peripheral surface of the exhaust system 94 and the damper 95b. Thus, in a case in which the damper 95b is located at the first rotation angular position, the gas in the processing space 2S is exhausted to the outside of the unit casing 2 through the exhaust system 94 at a first flow rate which is relatively low as indicated by the solid arrows in FIG. 3.

On the other hand, in the example of FIG. 4, the damper 95b being held at the second rotation angular position is shown. As shown in FIG. 4, the damper 95b closes substantially half of the gas flow path in the exhaust system 94 while being located at the second rotation angular position. Thus, in a case in which the damper 95b is located at the second rotation angular position, the gas in the processing space 2S is exhausted to the outside of the unit casing 2 through the exhaust system 94 at a second flow rate larger than the first flow rate as indicated by the thick solid arrows in FIG. 4.

On the other hand, in the example of FIG. 5, the damper 95b being held at the third rotation angular position is shown. As shown in FIG. 5, the damper 95b releases a large portion of the gas flow path in the exhaust system 94 while being located at the third rotation angular position. Thus, in a case in which the damper 95b is located at the third rotation angular position, the gas in the processing space 2S is exhausted to the outside of the unit casing 2 through the exhaust system 94 at a third flow rate larger than the second flow rate as indicated by the outlined arrows in FIG. 5.

As described above, with the exhaust amount regulator 95, it is possible to regulate the flow rate of gas to be exhausted by the exhaust equipment 99 through the exhaust system 94 from the processing space 2S by regulating the rotation angular position of the damper 95b. Here, the flow rate of gas to be exhausted through the exhaust system 94 is an amount of gas flowing through the exhaust system 94 per unit time.

As shown in FIG. 2, at height positions farther upward than the cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can support the lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of a substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 6) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of a substrate W is cleaned, the spray nozzle 73 mixes a cleaning liquid and gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts or lowers the rotation support shaft 71 and rotates the rotation support shaft 71. With the above-mentioned configuration, on the upper surface of a substrate W held by suction and rotated by the suction holder 21, the spray nozzle 73 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of a substrate W can be cleaned by the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

Figure 6:
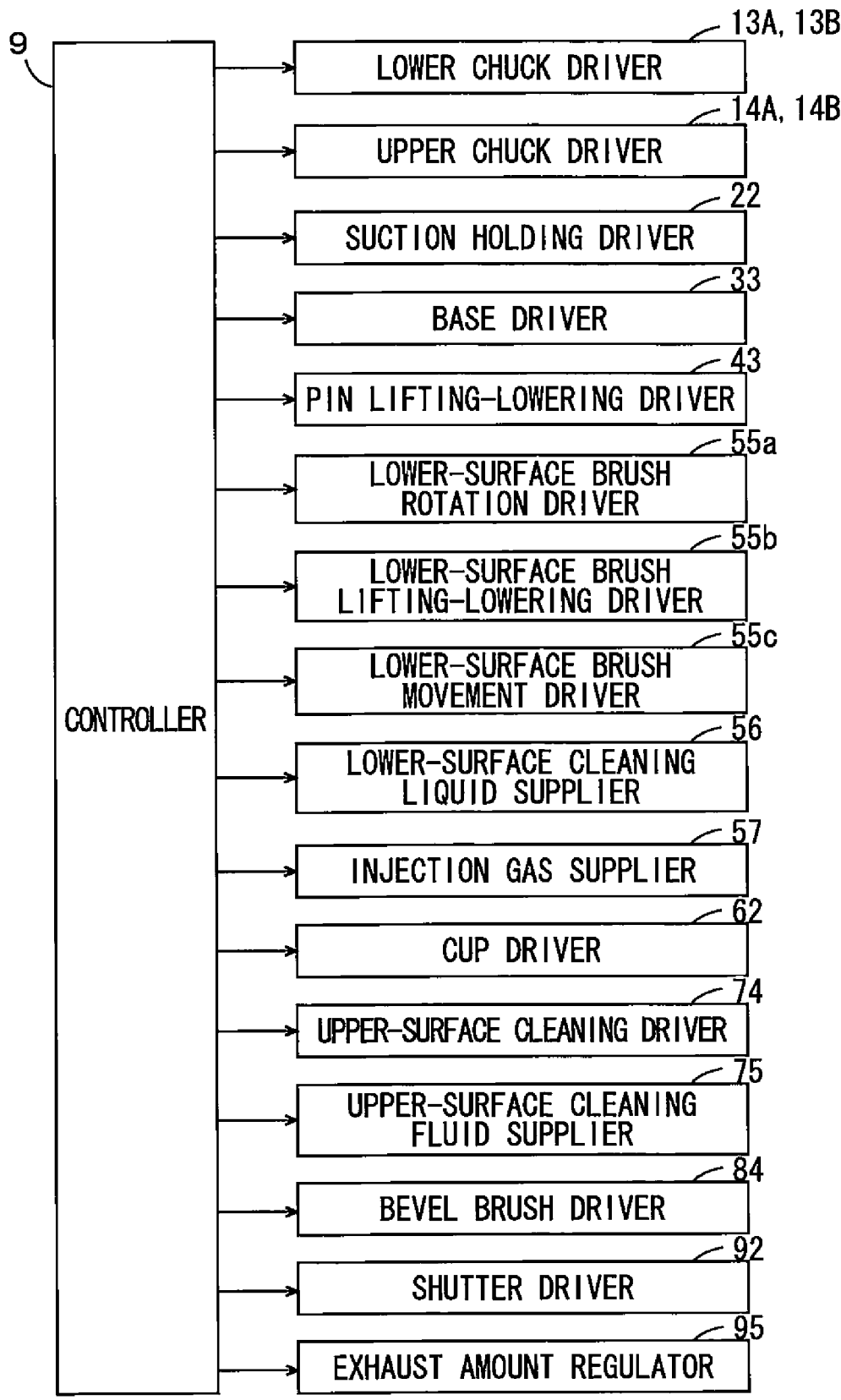
FIG. 6 is a block diagram showing the configuration of a control system of the substrate cleaning device of FIG. 1.

FIG. 6 is a block diagram showing the configuration of a control system of the substrate cleaning device 1 of FIG. 1. The controller 9 of FIG. 6 includes a CPU (Central Processing Unit), a RAM (Random Access Memory), a ROM (Read Only Memory) and a storage device. The RAM is used as a work area for the CPU. The ROM stores a system program. The storage device stores a control program. The operation of each component in the substrate cleaning device 1 is controlled by execution of a substrate cleaning program stored in the storage device on the RAM by the CPU.

As shown in FIG. 6, the controller 9 controls the lower chuck drivers 13A, 13B and the upper chuck drivers 14A, 14B in order to mainly receive a substrate W that is carried into the substrate cleaning device 1 and hold the substrate W at a position above the suction holder 21. Further, the controller 9 mainly controls the suction holding driver 22 in order to hold a substrate W by suction using the suction holder 21 and rotate the substrate W held by suction.

Further, the controller 9 mainly controls the base driver 33 in order to move the mobile base 32 with respect to a substrate W held by the upper holding devices 10A, 10B. Further, the controller 9 controls the pin lifting-lowering driver 43 in order to move a substrate W between a height position of the substrate W held by the upper holding devices 10A, 10B and a height position of the substrate W held by the suction holder 21.

Further, the controller 9 controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of a substrate W. Further, the controller 9 controls the cup driver 62 in order to receive a cleaning liquid splashed from a substrate W using the cup 61 when the substrate W held by the suction by the suction holder 21 is cleaned.

Further, the controller 9 controls the upper-surface cleaning driver 74 and the upper-surface cleaning fluid supplier 75 in order to clean the upper surface of a substrate W held by suction by the suction holder 21. Further, the controller 9 controls the bevel brush driver 84 in order to clean the outer peripheral end of a substrate W held by suction by the suction holder 21. Further, the controller 9 controls the shutter driver 92 in order to open and close the inlet-outlet port 2x of the unit casing 2 when a substrate W is carried into and carried out from a substrate cleaning device 1. Further, the controller 9 controls the exhaust amount regulator 95 in order to regulate the flow rate of gas flowing through the exhaust system 94.

2. Schematic Operation of Substrate Cleaning Device

FIGS. 7 to 18 are schematic diagrams for explaining the schematic operation of the substrate cleaning device 1 of FIG. 1. In each of FIGS. 7 to 18, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 7 to 18, the cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 1, the lower chucks 11A, 11B are maintained in a state in which the distance between the lower chucks 11A, 11B is sufficiently larger than the diameter of a substrate W. Further, the upper chucks 12A, 12B are also maintained in a state in which the distance between the upper chucks 12A, 12B is sufficiently larger than the diameter of a substrate W. Further, the mobile base 32 of the base device 30 is arranged such that the center of the suction holder 21 is located at the center of the cup 61 in a plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21.

Further, in the receiving-transferring device 40, the plurality of support pins 41 are located farther downwardly than the suction holder 21. Further, in the cup device 60, the cup 61 is in the lower cup position. In the following description, the center position of the cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 7, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 7.

Next, as indicated by the thick solid arrows a2 in FIG. 8, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Next, as indicated by the thick solid arrows a3 in FIG. 9, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. Further, as indicated by the thick solid arrow a4 in FIG. 9, the mobile base 32 is moved forwardly from the first horizontal position, such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Next, as indicated by the thick solid arrow a5 in FIG. 10, the lifting-lowering supporter 54 is lifted such that the cleaning surface of the lower-surface brush 51 comes into contact with the lower-surface center region of the substrate W. Further, as indicated by the thick solid arrow a6 in FIG. 10, the lower-surface brush 51 is rotated (spins) about the axis extending in the up-and-down direction. Thus, contaminants adhering to the lower-surface center region of the substrate W are physically stripped by the lower-surface brush 51.

In the bottom field in FIG. 10, an enlarged side view of a portion in which the lower-surface brush 51 comes into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to the contact portion in which the lower-surface brush 51 and the substrate W are in contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54u of the lifting-lowering supporter 54 is inclined downwardly in a direction away from the suction holder 21. In this case, in a case where the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 10. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 10, the present invention is not limited to this. The gas injector 53 may inject gas in the Z direction toward the lower surface of the substrate W from the gas injector 53.

Next, in the state of FIG. 10, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Thereafter, as indicated by the thick solid arrow a7 in FIG. 11, the mobile base 32 is moved rearwardly such that the suction holder 21 is located at the plane reference position rp. That is, the mobile base 32 is moved from the second horizontal position to the first horizontal position. At this time, injection of gas from the gas injector 53 to the substrate W continues, so that the lower-surface center region of the substrate W is sequentially dried by a gas curtain.

Next, as indicated by the thick solid arrow a8 in FIG. 12, the lifting-lowering supporter 54 is lowered such that the cleaning surface of the lower-surface brush 51 is located farther downwardly than the suction surface (upper end portion) of the suction holder 21. Further, as indicated by the thick solid arrows a9 in FIG. 12, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 12, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 13, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Next, as indicated by the thick solid arrow a12 in FIG. 14, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 14.

Next, as indicated by the thick solid arrow a14 in FIG. 15, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 15, the spray nozzle 73 is moved to a position above the center of the substrate W, and the spray nozzle 73 is lowered such that the distance between the spray nozzle 73 and the substrate W is a predetermined distance. In this state, the spray nozzle 73 injects a fluid mixture of the cleaning liquid and gas to the upper surface of the substrate W. Further, the rotation support shaft 71 is rotated. Thus, as indicated by the thick solid arrow a16 in FIG. 15, the spray nozzle 73 moves outwardly from the center of the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 15, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 15, the lower-surface brush 51 is rotated (spins) about the axis extending in the up-and-down direction. Further, the liquid nozzle 52 discharges the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51.

The rotation direction of the lower-surface brush 51 may be opposite to the rotation direction of the suction holder 21. In this case, the lower-surface outer region of the substrate W can be cleaned efficiently. In a case in which the lower-surface brush 51 is not relatively large, the movement supporter 55 may advance and retreat between the proximal position and the distal position on the mobile base 32 as indicated by the thick solid arrow a19 in FIG. 15. Even in this case, it is possible to clean the entire lower-surface outer region of the substrate W held by suction and rotated by the suction holder 21 using the lower-surface brush 51. During cleaning (during a cleaning process) of the upper surface, the outer peripheral end and the lower-surface outer region of the substrate W, the rotation speed of the substrate W is set to about 200 rpm to 500 rpm, for example, as a first rotation speed.

Next, when cleaning of the upper surface, the outer peripheral end and the lower-surface outer region of the substrate W is completed, injection of a fluid mixture from the spray nozzle 73 to the substrate W is stopped. Further, as indicated by the thick solid arrow a20 in FIG. 16, the spray nozzle 73 is moved to a position near one side of the cup 61 (the position in the initial state). Further, as indicated by the thick solid arrow a21 in FIG. 16, the bevel brush 83 is moved to a position near the other side of the cup (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried (a drying process). When the cleaning liquid is shaken off from the substrate W (during the drying process), the rotation speed of the substrate W is set to about 2000 rpm to 4000 rpm as a second rotation speed higher than the first rotation speed.

Next, as indicated by the thick solid arrow a22 in FIG. 17, the cup 61 is lowered from the upper cup position to the lower cup position. Further, as indicated by the thick solid arrows a23 in FIG. 17, the lower chucks 11A, 11B move closer to each other to positions at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 18, the hand (substrate holder) RH of the substrate transferring robot (not shown) enters the unit casing 2 through the inlet-outlet port 2x. Subsequently, the hand RH receives the substrate W on the suction holder 21 and exits from the inlet-outlet port 2x. After the hand RH exits, the shutter 91 closes the inlet-outlet port 2x.

3. Control Example of Exhaust Amount Regulator 95

In the controller 9 according to the present embodiment, a table representing the relationship among a holding state of a substrate W, a processing state of the substrate W and a flow rate of gas to be exhausted from the processing space 2S is stored in advance in the storage device as an exhaust regulation table. Hereinafter, the flow rate of gas to be exhausted from the processing space 2S through the exhaust system 94 is referred to as a target flow rate. FIG. 19 is a diagram showing one example of an exhaust regulation table.

In the exhaust regulation table of FIG. 19, a target flow rate is set to the first flow rate in regard to a substrate W, which is not being held by any of the upper holding device 10A, 10B or the suction holder 21. Further, a target flow rate is set to the first flow rate in regard to a substrate W, which is being held by the upper holding devices 10A, 10B and not being processed. Further, a target flow rate is set to the first flow rate in regard to a substrate W, which is being held by the upper holding devices 10A, 10B, and being cleaned or dried. When being held by the upper holding devices 10A, 10B, a substrate W is not rotated, and the cup 61 of FIG. 2 is located at the lower cup position.

Further, a target flow rate is set to the second flow rate in regard to a substrate W, which is being held by the suction holder 21 and not being processed. Further, a target flow rate is set to the second flow rate in regard to a substrate W, which is being held by the suction holder 21 and being cleaned. Further, a target flow rate is set to the third flow rate in regard to a substrate W, which is being held by the suction holder 21 and being dried. When being held by the suction holder 21 and not being processed, the substrate W is not rotated, and the cup 61 of FIG. 6 is located at the lower cup position. When being held by the suction holder 21, and being cleaned or dried, a substrate W is rotated and the cup 61 of FIG. 2 is located at the upper cup position.

The controller 9 controls the exhaust amount regulator 95 based on the exhaust regulation table of FIG. 19 during a series of operations of the substrate cleaning device 1 of FIGS. 7 to 18. Specifically, when the substrate cleaning device 1 is in the state shown in FIGS. 7, 8, 9, 10, 11, 12 and 13, the controller 9 controls the exhaust amount regulator 95 with a target flow rate set to a first flow rate. Further, when the substrate cleaning device 1 is in the state shown in FIGS. 14, 15, 17 and 18, the controller 9 controls the exhaust amount regulator 95 with a target flow rate set to the second flow rate. Further, when the substrate cleaning device 1 is in the state shown in FIG. 16, that is, when a cleaning liquid on a substrate W is shaken off (during the drying process), the controller 9 controls the exhaust amount regulator 95 with a target flow rate set to the third flow rate.

4. Effects of Substrate Cleaning Device 1

(1) In the above-mentioned substrate cleaning device 1, a substrate W is held by the upper holding devices 10A, 10B in a horizontal attitude without rotating. In this state, the substrate W is cleaned. When the substrate W held by the upper holding devices 10A, 10B is cleaned, the substrate W is not rotated. Thus, a cleaning liquid is unlikely to be splashed from the substrate W. Therefore, even in a case in which the gas in the processing space 2S is exhausted at a first flow rate which is relatively low, high cleanliness in the processing space is maintained.

Further, in the above-mentioned substrate cleaning device 1, the lower holding device 20 rotates a substrate W about an axis extending in the up-and-down direction while holding the substrate W in a horizontal attitude. In this state, the substrate W is cleaned. When the substrate W held by the lower holding device 20 is cleaned or dried, the substrate W is rotated. Thus, a cleaning liquid is likely to be splashed from the substrate W. As such, in a case in which the substrate W is held by the lower holding device 20, the gas in the processing space 2S is exhausted at the second or third flow rate, which is relatively high. In this case, a cleaning liquid splashed from the substrate W is efficiently discharged from the processing space 2S. Thus, degradation of cleanliness in the processing space 2S is suppressed.

With the above-mentioned configuration, exhaust capacity of the exhaust equipment 99 required in one substrate cleaning device 1 is regulated over time. Therefore, in a case in which being used with respect to one exhaust equipment 99, a plurality of substrate cleaning devices 1 can be controlled such that a substrate W held by the lower holding device 20 is not cleaned and dried simultaneously. In this case, the level of the exhaust capacity of the exhaust equipment 99 simultaneously required with respect to the plurality of substrate cleaning devices 1 is reduced. Thus, it is possible to maintain high cleanliness of the processing spaces 2S of a larger number of substrate cleaning devices 1 by using the exhaust equipment 99 having predetermined exhaust capacity.

(2) In a case in which a substrate W to which a cleaning liquid adheres is rotated, the higher the rotation speed is, the more likely the mist of the cleaning liquid splashed from the substrate W is to be diffused in the processing space 2S. With the above-mentioned configuration, a third rotation speed of a substrate W during shake-off of a cleaning liquid is higher than a second rotation speed of a substrate W during cleaning. Therefore, when the cleaning liquid is shaken off from the substrate W, the mist of the cleaning liquid is likely to be diffused in the processing space 2S. Even in such a case, when the cleaning liquid is shaken off from the substrate W, the gas in the processing space 2S is exhausted at the third flow rate, which is higher than the first and second flow rates during cleaning of the substrate W. Therefore, when the cleaning liquid is shaken off from the substrate W, high cleanliness of the processing space 2S is maintained.

Further, with the above-mentioned configuration, due to the rotation speed of a substrate W, an amount of mist of the cleaning liquid splashed in the processing space 2S during cleaning of the substrate W is smaller than an amount of mist of the cleaning liquid splashed in the processing space 2S during shake-off drying of the substrate W. Thus, even in a case in which the second flow rate of gas exhausted during cleaning of a substrate W is lower than the third flow rate of gas exhausted during shake-off of a cleaning liquid from the substrate W, gas is exhausted sufficiently such that cleanliness of the processing space 2S is maintained during cleaning of the substrate W. Therefore, the exhaust equipment 99 is prevented from being required to have excessive exhaust capacity with a substrate W held by the lower holding device 20.

(3) In the above-mentioned substrate cleaning device 1, the cup 61 is provided so as to surround the lower holding device 20 in a plan view. The exhaust system 94 is provided such that the gas in the processing space 2S is exhausted from the bottom portion of the cup 61. In this case, a cleaning liquid splashed from a substrate W held by the lower holding device 20 can be received by the cup 61. Further, the mist of the cleaning liquid splashed in the cup 61 is smoothly discharged from the bottom portion of the cup 61 to the outside of the unit casing 2.

5. Substrate Cleaning System Including Plurality of Substrate Cleaning Devices 1

(1) Basic Configuration of Substrate Cleaning System

FIG. 20 is a schematic plan view showing one example of a substrate cleaning system including a plurality of substrate cleaning devices 1. As shown in FIG. 20, the substrate cleaning system 100 according to the present embodiment has an indexer block 110 and a processing block 120. The indexer block 110 and the processing block 120 are provided to be adjacent to each other.

The indexer block 110 includes a plurality (four in the present example) of carrier platforms 140 and a transport section 150. The plurality of carrier platforms 140 are connected to the transport section 150. On each carrier platform 140, a carrier C for storing a plurality of substrates W in multiple stages is placed. In the transport section 150, an indexer robot IR and a control device 111 are provided. The indexer robot IR is configured to be movable in the transport section 150, rotatable about a vertical axis, liftable and lowerable. The indexer robot IR has two hands for receiving and transferring a substrate W. The control device 111 is made of a computer or the like including a CPU, a ROM and a RAM and controls each constituent element in the substrate cleaning system 100.

The processing block 120 includes a cleaning section 161 and a transport section 162. The cleaning section 161 and the transport section 162 are adjacent to the transport section 150 and arranged in this order. In the cleaning section 161, a plurality (four in the present example) of substrate cleaning devices 1 are arranged in a stack.

A main robot MR is provided in the transport section 163. The main robot MR is configured to be rotatable about a vertical axis, liftable and lowerable. The main robot MR has a two hands for receiving and transferring substrates W. A hand of the main robot MR is equivalent to the above-mentioned hand RH.

A plurality of substrate platforms PASS for receiving and transferring substrates W between the indexer robot IR and the main robot MR are stacked between the indexer block 110 and the processing block 120.

In the substrate cleaning system 100, the indexer robot IR takes out an unprocessed substrate W from one of the plurality of carriers C placed on the plurality of carrier platforms 140. Further, the indexer robot IR places the taken and unprocessed substrate W to any one of the plurality of substrate platforms PASS. Further, the indexer robot IR receives a processed substrate W placed on any one of the plurality of substrate platforms PASS and containing the substrate W in one carrier C.

Further, the main robot MR receives an unprocessed substrate W placed on any one of the plurality of substrate platforms PASS and carries the substrate W into any one of the plurality of substrate cleaning devices 1 in the cleaning section 161. Further, when a cleaning process ends in any one of the plurality of substrate cleaning devices 1, the main robot MR carries out a processed substrate W from the substrate cleaning device 1 and places the substrate W on any one of the plurality of substrate platforms PASS.

As described above, the substrate cleaning system 100 of FIG. 20 has the plurality of substrate cleaning devices 1 of FIG. 1. Thus, it is possible to clean the upper surface and the lower surface of a substrate W in one substrate cleaning device 1 without turning the substrate W. Therefore, the throughput of the process of cleaning the substrate W is improved. Further, an increase in footprint is sufficiently reduced by provision of the plurality of substrate cleaning devices 1 in a stack.

Figure 21:
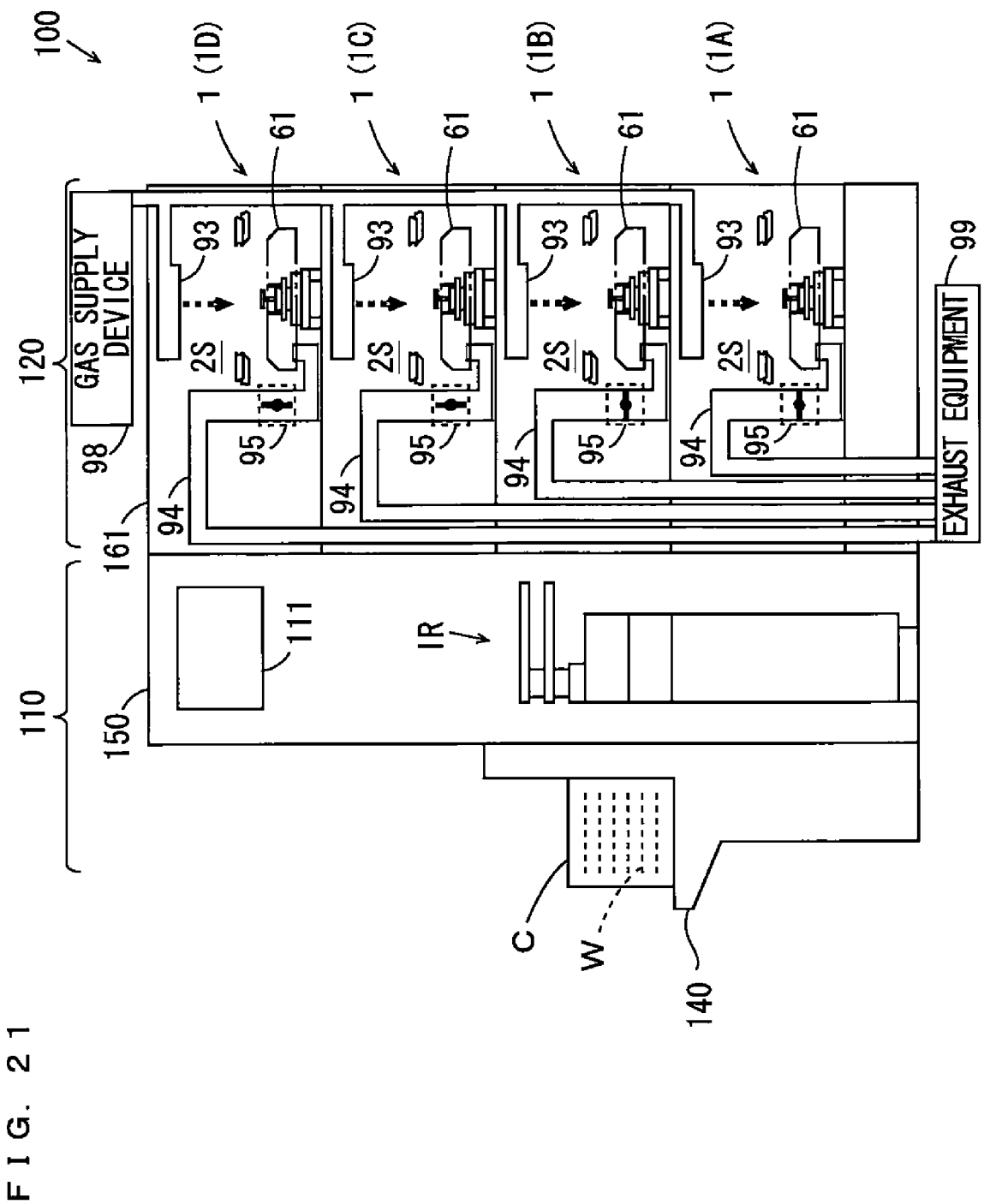
FIG. 21 is a schematic side view of the substrate cleaning system of FIG. 20.

FIG. 21 is a schematic side view of the substrate cleaning system 100 of FIG. 20. In the schematic side view of FIG. 21, the internal configuration of the transport section 150 and the internal configuration of the cleaning section 161 are mainly shown. As shown in FIG. 21, four substrate cleaning devices 1 are stacked in the cleaning section 161. In the following description, in a case in which the four substrate cleaning devices 1 of FIG. 21 are distinguished from each other, the substrate cleaning device 1 located at the lowermost position is referred to as a first substrate cleaning device 1A, and the substrate cleaning device 1 located at the second lowermost position from the bottom is referred to as a second substrate cleaning device 1B. Further, the substrate cleaning device 1 located at the third lowermost position from the bottom is referred to as a third substrate cleaning device 1C, and the substrate cleaning device 1 located at the uppermost position is referred to as a fourth substrate cleaning device 1D.

Clean air is supplied from a gas supply device 98 provided outside of the cleaning section 161 to a gas supply duct 93 included in each of the first to fourth substrate cleaning devices 1A to 1D. Thus, a downward flow of clean air is formed in a processing space 2S of each of the first to fourth substrate cleaning devices 1A to 1D.

In the present embodiment, one exhaust equipment 99 provided in a factory in which the substrate cleaning system 100 is installed is commonly used by the first to fourth substrate cleaning devices 1A to 1D included in the substrate cleaning system 100. Four exhaust systems 94 respectively included in the first to fourth substrate cleaning devices 1A to 1D connect the bottom portions of the four cups 61 of the first to fourth substrate cleaning devices 1A to 1D to the exhaust equipment 99.

The exhaust equipment 99 exhausts gas guided to the exhaust equipment 99 to the outside of the substrate cleaning system 100 with certain exhaust capacity. The gas in the processing space 2S of each of the first to fourth substrate cleaning devices 1A to 1D is exhausted to the outside of the substrate cleaning system 100 at any one of the first to third flow rates according to the state of the exhaust amount regulator 95 provided in the exhaust system 94 of the substrate cleaning device 1.

(2) One Control Example of Substrate Cleaning System

Here, out of the processing states of a substrate W described in the exhaust regulation table in FIG. 19, the state in which a substrate W is not held by any of the upper holding devices 10A, 10B and the suction holder 21 and the state in which the substrate W is held by the upper holding devices 10A, 10B, and being cleaned or dried are referred to as a first processing state (see the thick dotted frame in FIG. 19). Further, the state in which a substrate W is held by the suction holder 21 and not being processed, and the state in which a substrate W is held by the suction holder 21 and being cleaned are referred to as a second processing state (refer to the thick one-dot and dash frame in FIG. 19). Further, the state in which a substrate W is held by the suction holder 21 and being dried is referred to as a third processing state (see the thick two-dots and dash frame of FIG. 19).

For example, the control device 111 of the substrate cleaning system 100 controls the operations of the first to fourth substrate cleaning devices 1A to 1D such that the gas in the processing spaces 2S is not simultaneously exhausted at the third flow rate in regard to all of the first to fourth substrate cleaning devices 1A to 1D. Specific examples in regard to the control of the first to fourth substrate cleaning devices 1A to 1D in this case will be described.

Figure 22:
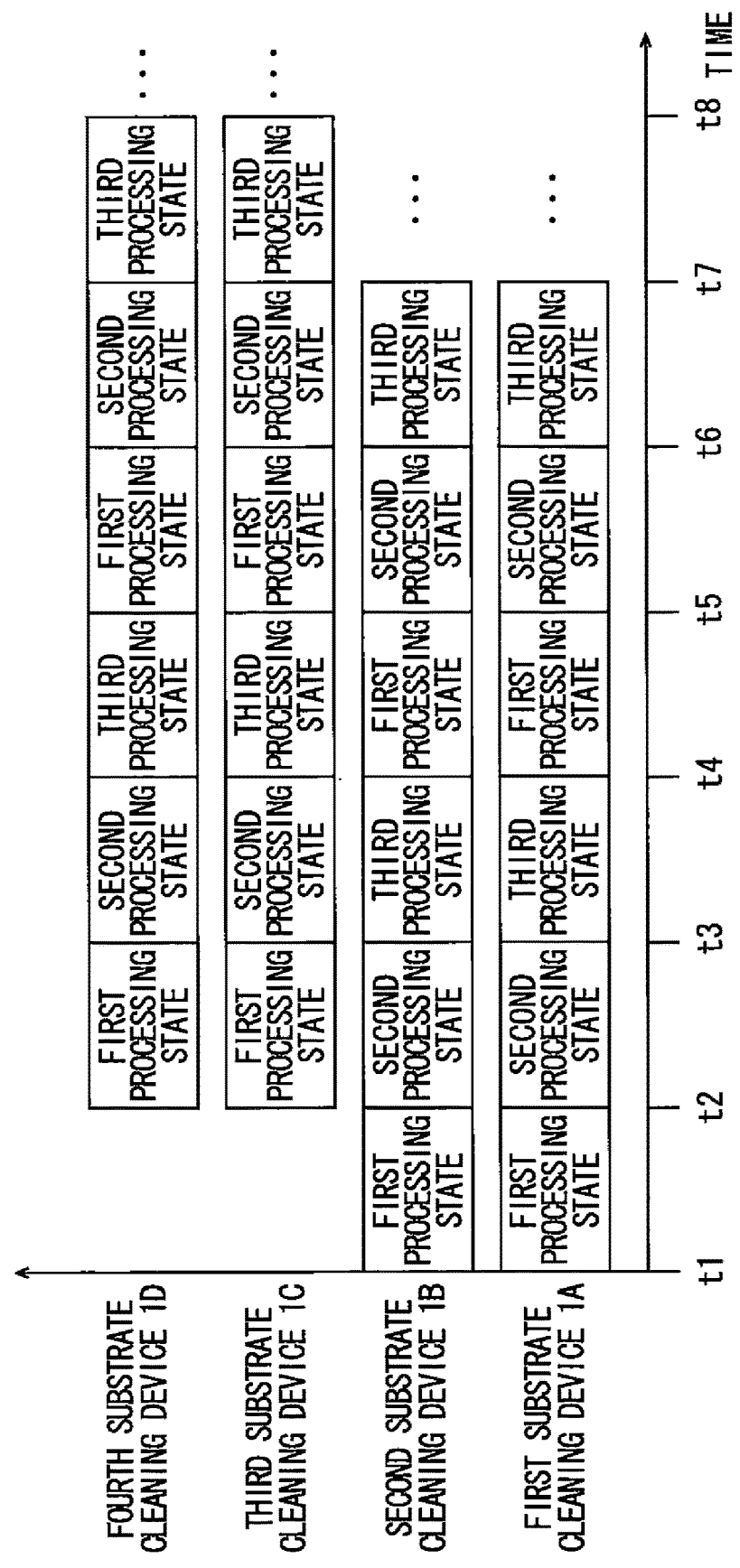
FIG. 22 is a diagram for explaining one control example of the first to fourth substrate cleaning devices in the substrate cleaning system of FIG. 21.

FIG. 22 is a diagram for explaining one control example of the first to fourth substrate cleaning devices 1A to 1D in the substrate cleaning system 100 of FIG. 21. In FIG. 22, the one control example of the first to fourth substrate cleaning devices 1A to 1D is shown in a time chart with use of a plurality of processing states of a substrate W.

In the example of FIG. 22, the operation of each component of the first substrate cleaning device 1A is controlled, such that a substrate W is kept in the first processing state from a point t1 to a point t2 in time, the substrate W is kept in the second processing state from the point t2 to a point t3 in time and the substrate W is kept in the third processing state from the point t3 to a point t4 in time. Then, after the point t4 in time, the operations performed from the point t1 to the point t4 in time are repeated. The operation of each component of the second substrate cleaning device 1B is controlled such that the same operations are performed at the same time as in the first substrate cleaning device 1A.

In contrast, the operation of each component of the third substrate cleaning device 1C is controlled, such that a substrate W is kept in the first processing state from the point t2 to the point t3 in time, the substrate W is kept in the second processing state from the point t3 to the point t4 in time and the substrate W is kept in the third processing state from the point t4 to a point t5 in time. Then, after the point t5 in time, the operations performed from the point t2 to the point t5 in time are repeated. The operation of each component of the fourth substrate cleaning device 1D is controlled such that the same operations are performed at the same time as in the third substrate cleaning device 1C.

With the control example of FIG. 22, in the substrate cleaning system 100, substrates W to be processed by the first to fourth substrate cleaning devices 1A to 1D are not simultaneously kept in the third processing state. Thus, the gas in the processing space 2S is prevented from being simultaneously exhausted at the third flow rate in regard to all of the first to fourth substrate cleaning devices 1A to 1D. In this case, the level of the exhaust capacity of the exhaust equipment 99 simultaneously required with respect to the plurality of substrate cleaning devices 1 is reduced. Thus, it is possible to maintain high cleanliness of the processing spaces 2S of a larger number of substrate cleaning devices 1 by using the exhaust equipment 99 having predetermined exhaust capacity.

(3) Another Control Example of Substrate Cleaning System

The control device 111 of the substrate cleaning system 100 is not limited to the example of FIG. 22. The control device 111 of the substrate cleaning system 100 may control the operations of the first to fourth substrate cleaning devices 1A to 1D such that the gas in the processing spaces 2S is not simultaneously exhausted at one of the second and third flow rates in regard to all of the first to fourth substrate cleaning devices 1A to 1D, for example. A specific example in regard to the control of the first to fourth substrate cleaning devices 1A to 1D in this case will be described.

Figure 23:
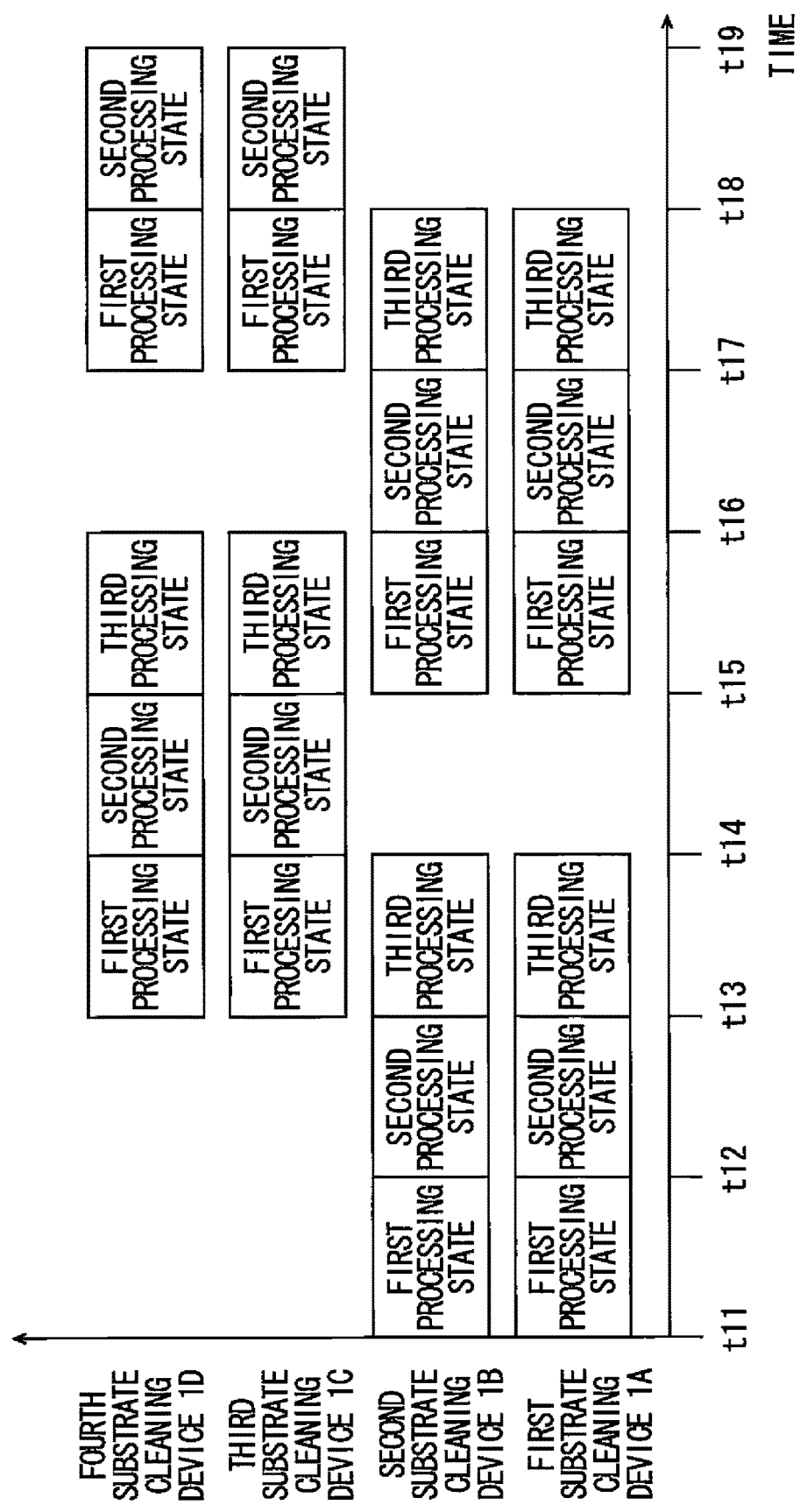
FIG. 23 is a diagram for explaining another control example of the first to fourth substrate cleaning devices in the substrate cleaning system of FIG. 21.

FIG. 23 is a diagram for explaining another control example of the first to fourth substrate cleaning devices 1A to 1D in the substrate cleaning system 100 of FIG. 21. In FIG. 23, similarly to the example of FIG. 22, another control example of the first to fourth substrate cleaning devices 1A to 1D is shown in a time chart with use of a plurality of processing states of the substrate W.

In the example of FIG. 23, the operation of each component of the first substrate cleaning device 1A is controlled, such that a substrate W is kept in the first processing state from a point t11 to a point t12 in time, the substrate W is kept in the second processing state from the point t12 to a point t13 in time and the substrate W is kept in the third processing state from the point t13 to a point t14 in time. Then, after the point t14 in time, the operations performed from the point t11 to the point t14 in time are repeated at certain intervals (a period of time required to keep a substrate W in the second processing state in the third substrate cleaning device 1C). The operation of each component of the second substrate cleaning device 1B is controlled such that the same operation is performed at the same time as in the first substrate cleaning device 1A.

In contrast, the operation of each component of the third substrate cleaning device 1C is controlled, such that a substrate W is kept in the first processing state from the point t13 to the point t14 in time, the substrate W is kept in the second processing state from the point t14 to a point t15 in time and the substrate W is kept in the third processing state from the point t15 to a point t16 in time. Then, after the point t16 in time, the operations performed from the point t13 to the point t16 in time are repeated at certain intervals (a period of time required to keep the substrate W in the second processing state in the first substrate cleaning device 1A). The operation of each component of the fourth substrate cleaning device 1D is controlled such that the same operation is performed at the same time as in the third substrate cleaning device 1C.

With the control example of FIG. 23, in the substrate cleaning system 100, substrates W to be processed by the first to fourth substrate cleaning devices 1A to 1D are not simultaneously kept in at least one of the second and third processing states. Thus, the gas in the processing spaces 2S is prevented from being simultaneously exhausted at at least one of the second and third flow rates in regard to all of the first to fourth substrate cleaning devices 1A to 1D.

In this case, the level of the exhaust capacity of the exhaust equipment 99 simultaneously required with respect to the plurality of substrate cleaning devices 1 is reduced. Thus, it is possible to maintain high cleanliness of the processing spaces 2S of a larger number of substrate cleaning devices 1 by using the exhaust equipment 99 having predetermined exhaust capacity.

6. Other Embodiments (1) While a clearance is formed between the inner peripheral surface of the exhaust system 94 and the damper 95b with the damper 95b of the exhaust amount regulator 95 at the first rotation angular position in the above-mentioned embodiment, the present invention is not limited to this. A clearance does not have to be formed between the inner peripheral surface of the exhaust system 94 and the damper 95b with the damper 95b of the exhaust amount regulator 95 located at the first rotation angular position. That is, the damper 95b may completely close the gas flow path in the exhaust system 94 while being located at the first rotation angular position. In this case, in the substrate cleaning device 1, the gas in the processing space 2S is not exhausted to the outside of the substrate cleaning device 1 when the substrate W is in the first processing state.

(2) In the substrate cleaning device 1 according to the above-mentioned embodiment, an exhaust opening (not shown) may be formed in the bottom surface portion 2a of the unit casing 2. In this case, even in a case in which gas is not exhausted from the exhaust system 94 with a downward flow of clean air formed in the processing space 2S, part of the gas in the processing space 2S is exhausted from the opening of the exhaust port (not shown) to the outside of the unit casing 2.

(3) While the lower-surface center region of a substrate W is held by suction by the lower holding device 20 in the substrate cleaning device 1 according to the above-mentioned embodiment, the present invention is not limited to this. The substrate cleaning device 1 may include a holding device that holds the central portion of the upper surface of a substrate W by suction instead of the lower holding device 20. In this case, the holding device that holds the central portion of the upper surface of the substrate W by suction may be provided at positions farther upward than the upper holding devices 10A, 10B, for example.

(4) In the above embodiment, the substrate cleaning device 1 is described as one example of a substrate processing apparatus that performs a first process while holding a substrate W and not rotating the substrate W, and performs a second process while holding and rotating a substrate W. Further, the substrate cleaning system 100 including the plurality of substrate cleaning devices 1 is described. In the above-mentioned embodiment, a process of cleaning the lower-surface center region of a substrate W corresponds to the first process, and a process of cleaning the lower-surface outer region, the peripheral end and the upper surface of a substrate W corresponds to the second process. However, the present invention is not limited to the above example.

The substrate processing system is not limited to the above-mentioned example of the substrate cleaning device 1, and may include a plurality of substrate processing apparatuses that perform a process (a coating process, a thermal process, a film removal process or the like) other than the process of cleaning the substrate W as first and second processes that are different from each other.

(5) While the lower-surface outer region of a substrate W is cleaned in the lower holding device 20 after the lower-surface center region of the substrate W is cleaned in the upper holding devices 10A, 10B in the above-mentioned embodiment, the embodiment is not limited to this. The lower-surface center region of a substrate W may be cleaned in the upper holding devices 10A, 10B after the lower-surface outer region of the substrate W is cleaned in the lower holding device 20.

(6) While the substrate cleaning device 1 includes the controller 9 in the above-mentioned embodiment, the embodiment is not limited to this. In a case in which the substrate cleaning device 1 is configured to be controllable by an external information processing apparatus, the substrate cleaning device 1 does not have to include the controller 9. While the substrate cleaning system 100 includes the control device 111 in the above-mentioned embodiment, the embodiment is not limited to this. In a case in which being configured to be controllable by an external information processing apparatus, the substrate cleaning system 100 does not have to include the control device 111.

7. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of constituent elements recited in the claims, various other elements having configurations or functions described in the claims can be also used.

In the above-mentioned embodiment, the substrate W is an example of a substrate, the substrate cleaning device 1 is an example of a substrate cleaning device and a substrate processing apparatus, the processing space 2S is an example of a processing space, the unit casing 2 is an example of a processing chamber, the upper holding devices 10A, 10B are examples of a first substrate holder, and the lower holding device 20 is an example of a second substrate holder.

Further, the lower-surface cleaning device 50, the upper-surface cleaning device 70 and the end-portion cleaning device 80 are examples of a cleaner and a processor, the exhaust equipment 99 is an example of exhaust equipment, the exhaust system 94 is an example of an exhaust system, and the exhaust amount regulator 95 is an example of an exhaust amount regulator.

Further, the first flow rate in the above-mentioned embodiment is an example of a first flow rate, the second and third flow rates in the above-mentioned embodiment are examples of a second flow rate, the second flow rate in the above-mentioned embodiment is an example of a third flow rate, and the third flow rate in the above-mentioned embodiment is an example of a fourth flow rate.

Further, the cup 61 is an example of a processing cup, the upper cup position is an example of a first height position, the lower cup position is an example of a second height position, the cup driver 62 is an example of a cup driver, the control device 111 is an example of a cleaning controller and a processing controller, and the substrate cleaning system 100 is an example of a substrate cleaning system and a substrate processing system.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate cleaning device that cleans a substrate, comprising:
   a processing chamber having a processing space capable of containing a substrate;
   a first substrate holder that is in the processing space of the processing chamber and holds a substrate in a horizontal attitude without rotating the substrate by abutting against a plurality of portions of the substrate;
   a second substrate holder that is in the processing space of the processing chamber and rotates a substrate about an axis extending in an up-and-down direction while holding the substrate in a horizontal attitude by sucking the substrate;
   a cleaner that cleans a substrate held by the first substrate holder using a cleaning liquid and cleans a substrate held by the second substrate holder using a cleaning liquid before or after the substrate held by the first substrate holder is cleaned, in the processing space;
   an exhaust system that connects the processing space and exhaust equipment provided outside of the processing chamber to each other, and exhausts gas in the processing space using the exhaust equipment; and
   an exhaust amount regulator that regulates a flow rate of gas flowing through the exhaust system, such that gas in the processing space is not exhausted when a substrate is held by the first substrate holder during cleaning of the substrate with use of a cleaning liquid, or the gas in the processing space is exhausted at a first flow rate when a substrate is held by the first substrate holder during cleaning of the substrate with use of a cleaning liquid, and regulates a flow rate of gas flowing through the exhaust system, such that gas in the processing space is exhausted at a second flow rate that is higher than the first flow rate when a substrate is held by the second substrate holder during cleaning of the substrate with use of a cleaning liquid.

2. The substrate cleaning device according to claim 1, wherein the second substrate holder rotates a substrate such that a cleaning liquid used for cleaning is shaken off from the substrate after the substrate held by the second substrate holder is cleaned.

3. The substrate cleaning device according to claim 2, wherein the second substrate holder rotates a substrate at a first rotation speed during cleaning of the substrate held by the second substrate holder, and rotates the substrate at a second rotation speed that is higher than the first rotation speed during shake-off of a cleaning liquid from the substrate, and the exhaust amount regulator regulates a flow rate of gas flowing through the exhaust system such that gas in the processing space is exhausted at a third flow rate higher than the second flow rate during shake-off of a cleaning liquid from a substrate by the second substrate holder.

4. The substrate cleaning device according to claim 1, further comprising a processing cup provided to surround the second substrate holder in a plan view, wherein the exhaust system is provided to exhaust gas in the processing space from a bottom portion of the processing cup.

5. The substrate cleaning device according to claim 4, further comprising a cup driver that supports the processing cup, and moves the processing cup in an up-and-down direction between a first height position at which the processing cup overlaps with a substrate held by the second substrate holder in a side view and a second height position at which the processing cup is located farther downwardly than the substrate held by the second substrate holder in a side view, wherein the cup driver supports the processing cup at the first height position such that the processing cup receives a cleaning liquid splashed from a substrate when the substrate is held by the second substrate holder, and supports the processing cup at the second height position when a substrate is held by the first substrate holder.

6. A substrate cleaning system having a plurality of the substrate cleaning devices according to claim 1 and comprising a cleaning controller, wherein the exhaust equipment is used commonly by the plurality of the substrate cleaning devices, and the cleaning controller controls operations of the plurality of the substrate cleaning devices such that substrates are not held simultaneously by the second substrate holders in the plurality of substrate cleaning devices.

7. A substrate cleaning system having a plurality of the substrate cleaning devices according to claim 2 and comprising a cleaning controller, wherein the exhaust equipment is used commonly by the plurality of the substrate cleaning devices, and the cleaning controller controls operations of the plurality of the substrate cleaning devices such that a cleaning liquid is not shaken off simultaneously from substrates in the plurality of the substrate cleaning devices.

8. A substrate processing system that performs a predetermined process on a substrate, comprising:

a plurality of substrate processing apparatuses; and a processing controller that controls the plurality of substrate processing apparatuses, wherein each of the plurality of substrate processing apparatuses includes a processing chamber having a processing space capable of containing a substrate, a first substrate holder that holds a substrate in a horizontal attitude without rotating the substrate by abutting against a plurality of portions of the substrate, a second substrate holder that rotates a substrate about an axis extending in an up-and-down direction while holding the substrate in a horizontal attitude by sucking the substrate, a processor that performs a first process on a substrate and performs a second process on the substrate before the first process or after the first process in the processing space, an exhaust system that connects the processing space and exhaust equipment provided outside of the processing chamber to each other, and exhausts gas in the processing space using the exhaust equipment, and an exhaust amount regulator that regulates a flow rate of gas flowing through the exhaust system such that gas in the processing space is not exhausted when a substrate is held by the first substrate holder during cleaning of the substrate with use of a cleaning liquid, or the gas in the processing space is exhausted at a first flow rate during cleaning of the substrate with use of a cleaning liquid, and the gas in the processing space is exhausted at a second flow rate that is higher than the first flow rate during cleaning of the substrate with use of a cleaning liquid, the processing controller controls operations of the plurality of substrate processing apparatuses such that the second processes in the plurality of substrate processing apparatuses are performed sequentially, and not performed simultaneously and respectively on a plurality of substrates in the plurality of substrate processing apparatuses, the first process is cleaning the substrate held by the first substrate holder using a cleaning liquid without rotating the substrate, and the second process is cleaning the substrate held by the second substrate holder using a cleaning liquid while rotating the substrate.

* * * * *